(12) United States Patent
Goto et al.

(10) Patent No.: US 10,283,688 B2
(45) Date of Patent: May 7, 2019

(54) LIGHT EMITTING DEVICE

(71) Applicant: NICHIA CORPORATION, Anan-shi, Tokushima (JP)

(72) Inventors: Akira Goto, Tokushima (JP); Kunihito Sugimoto, Anan (JP)

(73) Assignee: NICHIA CORPORATION, Anan-shi (JP)

(*) Notice: Subject to any disclaimer, the term of this patent is extended or adjusted under 35 U.S.C. 154(b) by 5 days.

(21) Appl. No.: 15/680,984

(22) Filed: Aug. 18, 2017

(65) Prior Publication Data

US 2018/0053886 A1 Feb. 22, 2018

(30) Foreign Application Priority Data

Aug. 22, 2016 (JP) .................................. 2016-161820
May 25, 2017 (JP) .................................. 2017-103517

(51) Int. Cl.
*H01L 33/50* (2010.01)
*H01L 33/60* (2010.01)
(Continued)

(52) U.S. Cl.
CPC ........ *H01L 33/647* (2013.01); *F21V 19/0025* (2013.01); *H01L 25/0753* (2013.01); *H01L 33/62* (2013.01); *H01L 33/641* (2013.01); *H01L 33/642* (2013.01); *H05K 1/0204* (2013.01); *H05K 1/0206* (2013.01); *H05K 1/0298* (2013.01); *H05K 1/0306* (2013.01); *H05K 1/09* (2013.01); *H05K 1/181* (2013.01); *F21Y 2115/10* (2016.08); *H01L 33/505* (2013.01); *H01L 33/60* (2013.01); *H05K 2201/0187* (2013.01); *H05K 2201/09636* (2013.01);
(Continued)

(58) Field of Classification Search
CPC ..................................................... H01L 33/647
See application file for complete search history.

(56) References Cited

U.S. PATENT DOCUMENTS

2006/0220036 A1  10/2006  Lee et al.
2008/0291688 A1* 11/2008  Higashi ................. F21V 29/004
                                                                    362/516
(Continued)

FOREIGN PATENT DOCUMENTS

JP     2002-190672 A    7/2002
JP     2003-347746 A   12/2003
(Continued)

*Primary Examiner* — William A Harriston
(74) *Attorney, Agent, or Firm* — Global IP Counselors, LLP

(57) ABSTRACT

A light emitting device includes a mounting board, a first light emitting element and a second light emitting element. The mounting board includes an insulator which includes a front face and a back face, a pair of front face wiring parts disposed on the front face of the insulator, a connection wiring part disposed on the front face of the insulator and spaced apart from the front face wiring parts, a pair of back face terminals disposed on the back face of the insulator, first interlayer wiring parts penetrating the insulator and electrically connecting the front face wiring parts and the back face terminals, and one or more second interlayer wiring parts embedded in the insulator to be in contact with the connection wiring part, and spaced apart from the back face terminals.

40 Claims, 13 Drawing Sheets

(51) Int. Cl.
*H01L 33/62* (2010.01)
*H01L 33/64* (2010.01)
*H05K 1/02* (2006.01)
*H05K 1/03* (2006.01)
*H05K 1/09* (2006.01)
*H05K 1/18* (2006.01)
*F21V 19/00* (2006.01)
*H01L 25/075* (2006.01)
*F21Y 115/10* (2016.01)

(52) U.S. Cl.
CPC .............. *H05K 2201/10106* (2013.01); *H05K 2201/10674* (2013.01)

(56) References Cited

U.S. PATENT DOCUMENTS

| | | |
|---|---|---|
| 2011/0056734 A1 | 3/2011 | Andrews et al. |
| 2015/0116965 A1* | 4/2015 | Kim .................... H01L 23/5383 361/767 |
| 2016/0329284 A1 | 11/2016 | We et al. |

FOREIGN PATENT DOCUMENTS

| | | |
|---|---|---|
| JP | 2006-287188 A | 10/2006 |
| JP | 2008-294181 A | 12/2008 |
| JP | 3159040 U | 5/2010 |
| JP | 2012-151188 A | 8/2012 |
| JP | 2012-227230 A | 11/2012 |
| JP | 2014-192371 A | 10/2014 |

* cited by examiner

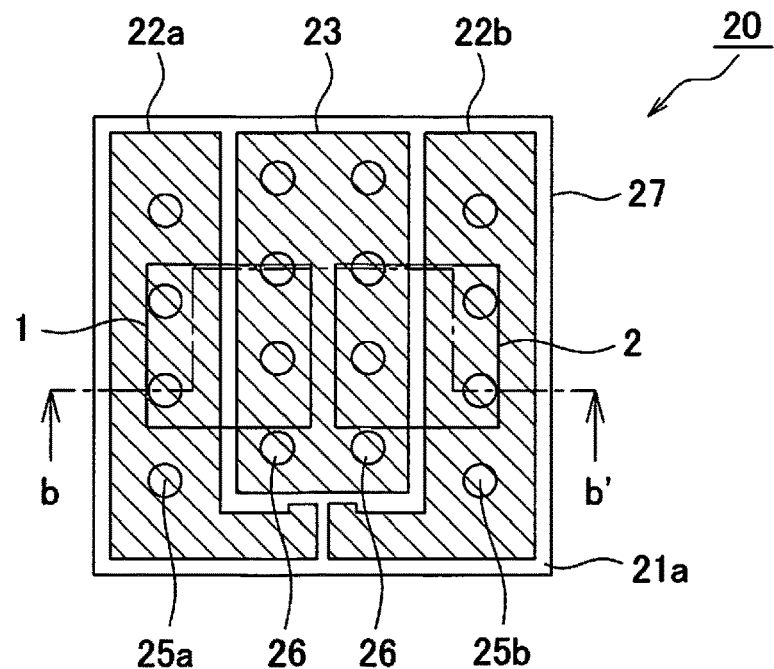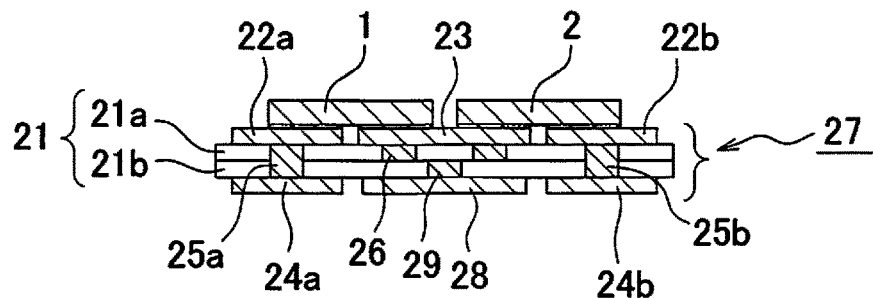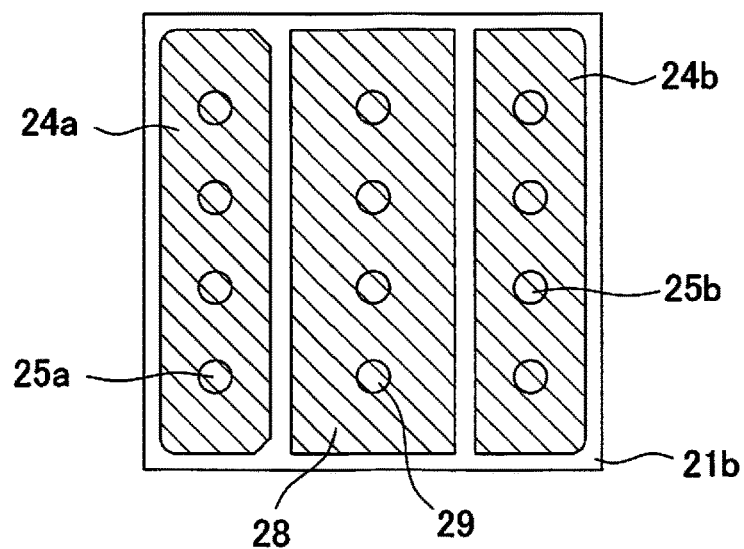

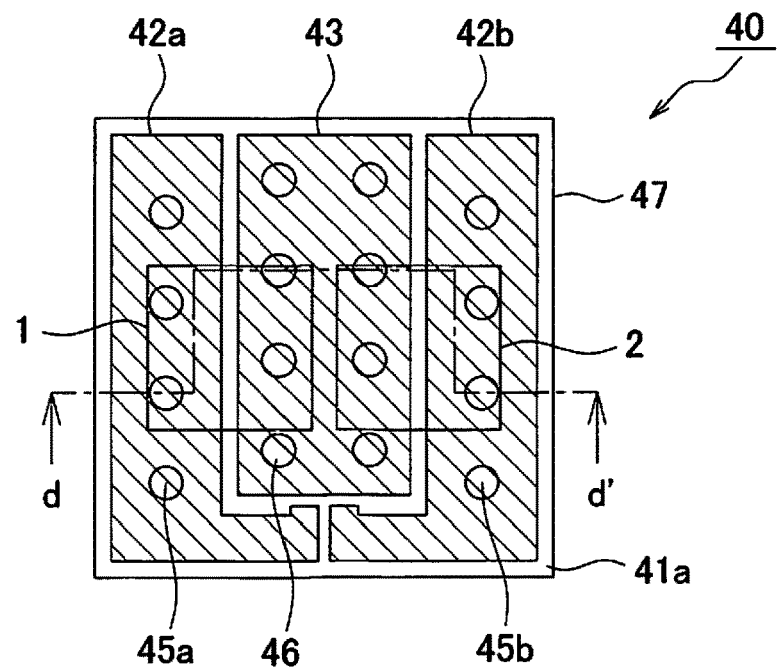
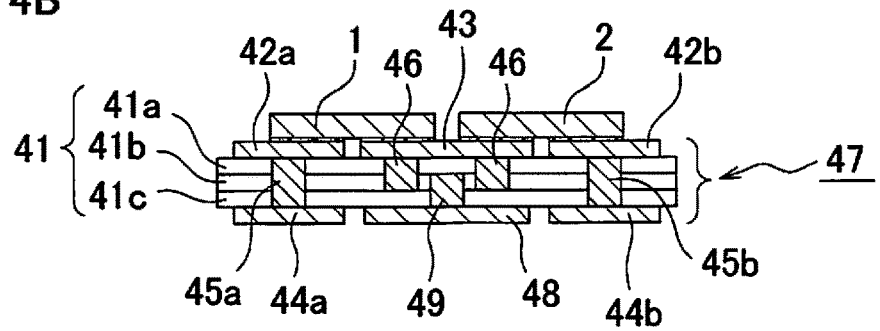
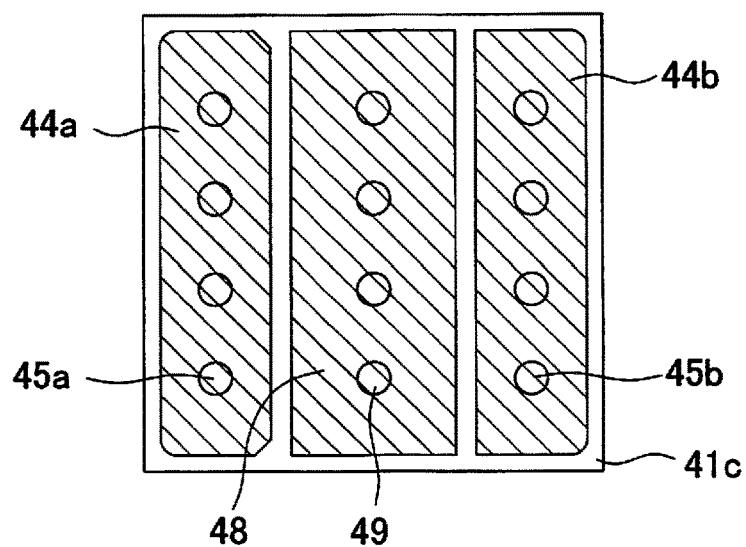

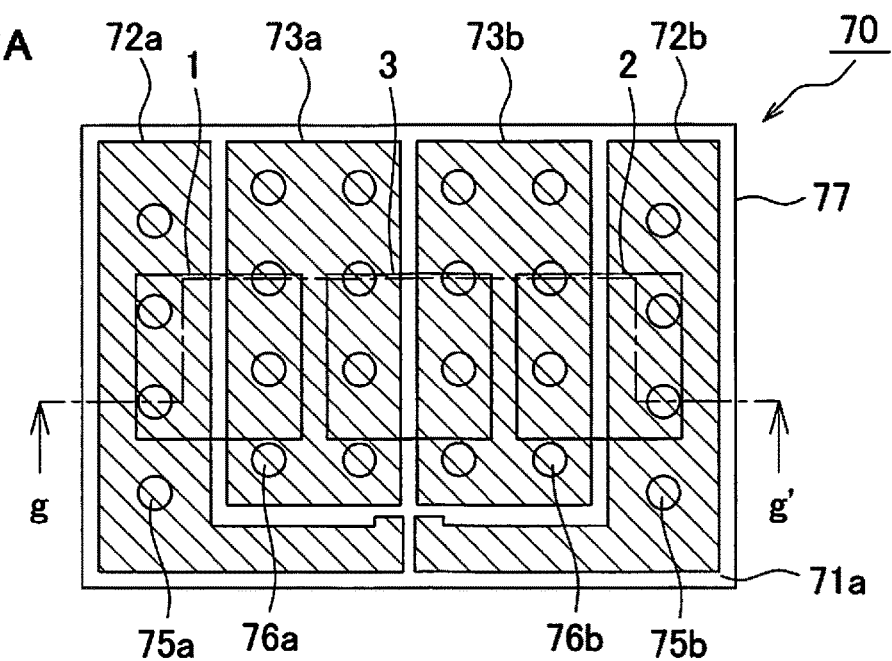
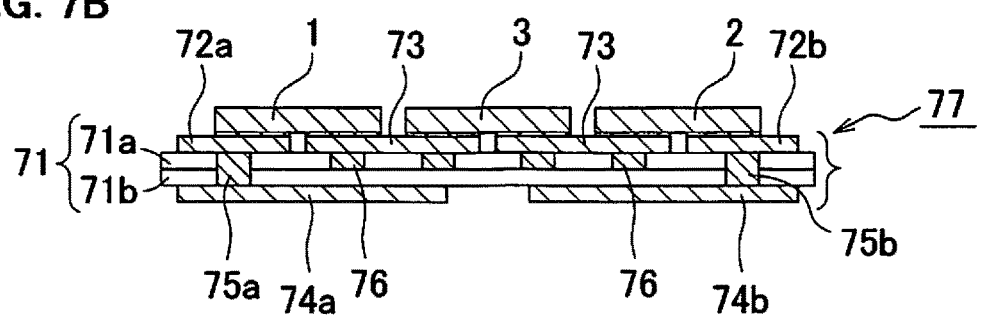
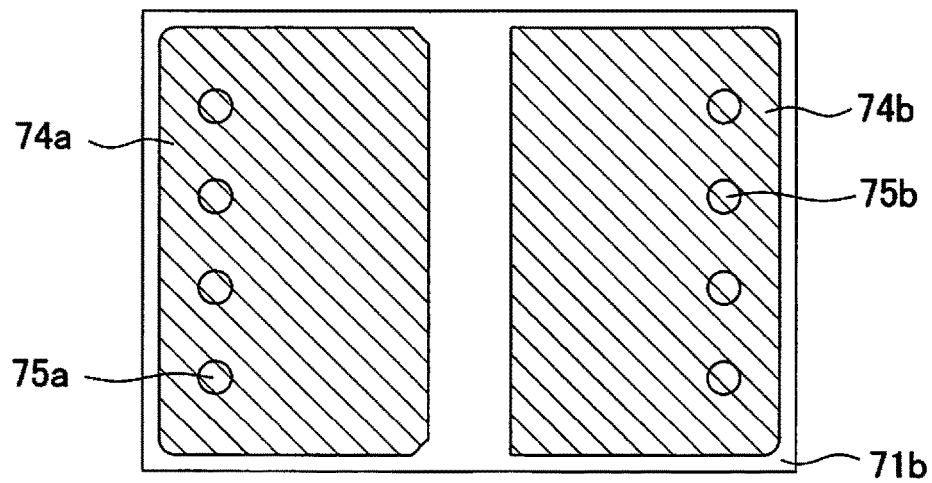

FIG. 12A
FIG. 12B
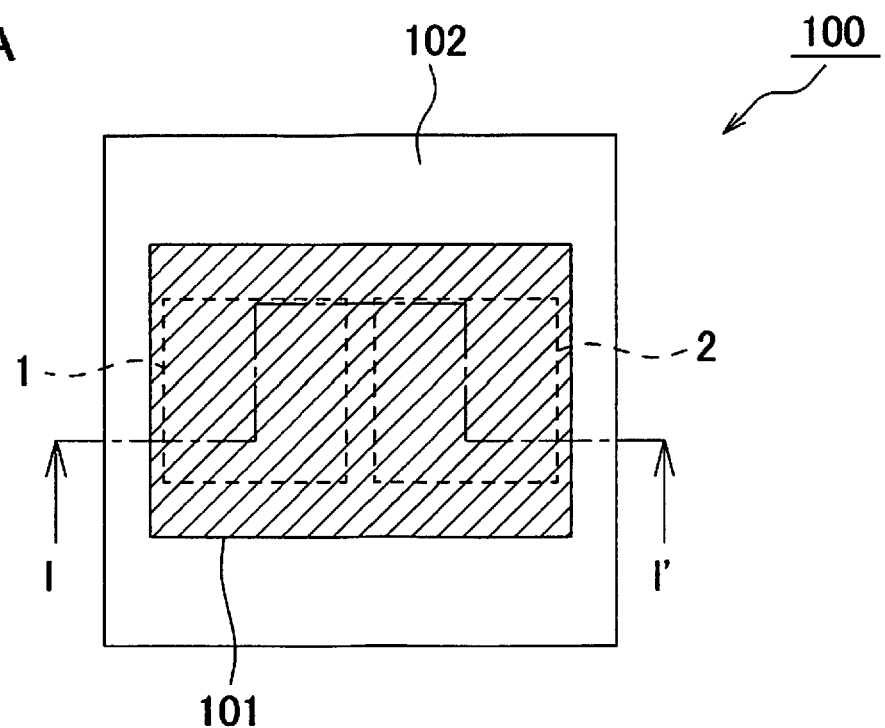
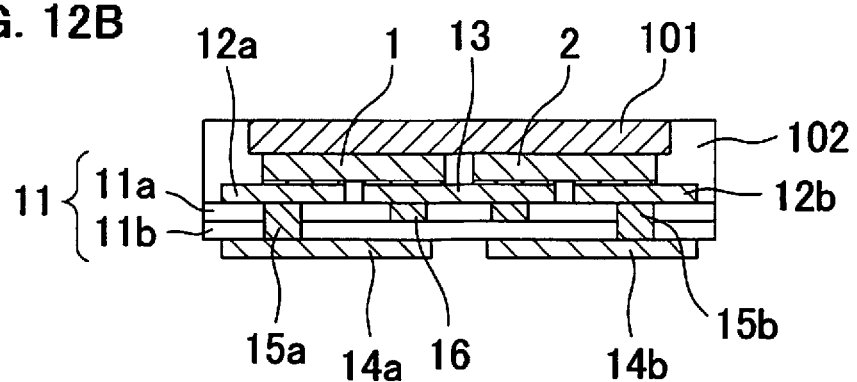

LIGHT EMITTING DEVICE

CROSS-REFERENCE TO RELATED APPLICATION

This application claims priority to Japanese Patent Application No. 2016-161820 filed on Aug. 22, 2016, and Japanese Patent Application No. 2017-103517 filed on May 25, 2017, the disclosures of which are hereby incorporated by reference in its entirety.

BACKGROUND

The present disclosure relates to a light emitting device.
In recent years, light emitting devices using high luminance light emitting elements, such as LEDs, have been utilized as light sources for projectors, vehicles, and the like. The heat generated from a light emitting element increases as the luminance of the light emitting element becomes higher. Thus, the heat needs to be quickly released from a light emitting device. Various ideas for speedily dissipating heat away from a light emitting device have been proposed, such as providing vias which connect the front and back faces of the mounting board on which a light emitting element is mounted. For example, see Japanese Patent Application Publication Nos. 2012-227230, 2012-151188, and 2002-190672, and Japanese Utility Model Registration No. 3159040.

SUMMARY

One object of the present disclosure is to provide a light emitting device capable of efficient heat dissipation due to less non-uniformity of heat dissipation effect across the light emitting device.

One embodiment of the present disclosure includes a light emitting device including: a mounting board which includes an insulator including a front face and a back face, a pair of front face wiring parts disposed on the front face of the insulator, a connection wiring part disposed on the front face of the insulator and spaced apart from the front face wiring parts, a pair of back face terminals disposed on the back face of the insulator, first interlayer wiring parts penetrating the insulator and electrically connecting the front face wiring parts and the back face terminals, and one or more second interlayer wiring parts embedded in the insulator to be in contact with the connection wiring part, and spaced apart from the back face terminals; a first light emitting element disposed to straddle one of the pair of front face wiring parts and the connection wiring part; and a second light emitting element disposed to straddle the other of the pair of front face wiring parts and the connection wiring part.

The present disclosure can provide a light emitting device capable of efficient heat dissipation due to less non-uniformity of heat dissipation effect across the light emitting device.

BRIEF DESCRIPTION OF THE DRAWINGS

FIG. 2A is a schematic plan view of a light emitting device according to Embodiment 2.
FIG. 2B is a schematic cross-sectional view taken along line b-b' of FIG. 2A.
FIG. 2C is a back face view of the light emitting device according to Embodiment 2.
FIG. 4A is a schematic plan view of a light emitting device according to Embodiment 4.
FIG. 4B is a schematic cross-sectional view taken along line d-d' of FIG. 4A.
FIG. 4C is a back face view of the light emitting device according to Embodiment 4.
FIG. 7A is a schematic plan view of a light emitting device according to Embodiment 7.
FIG. 7B is a schematic cross-sectional view taken along line g-g' of FIG. 7.
FIG. 7C is a back face view of the light emitting device according to Embodiment 7.
FIG. 12A is a schematic plan view of a light emitting device according to Embodiment 12.
FIG. 12B is a schematic cross-sectional view taken along line l-l' of FIG. 12.

DESCRIPTION

Figure 1A:
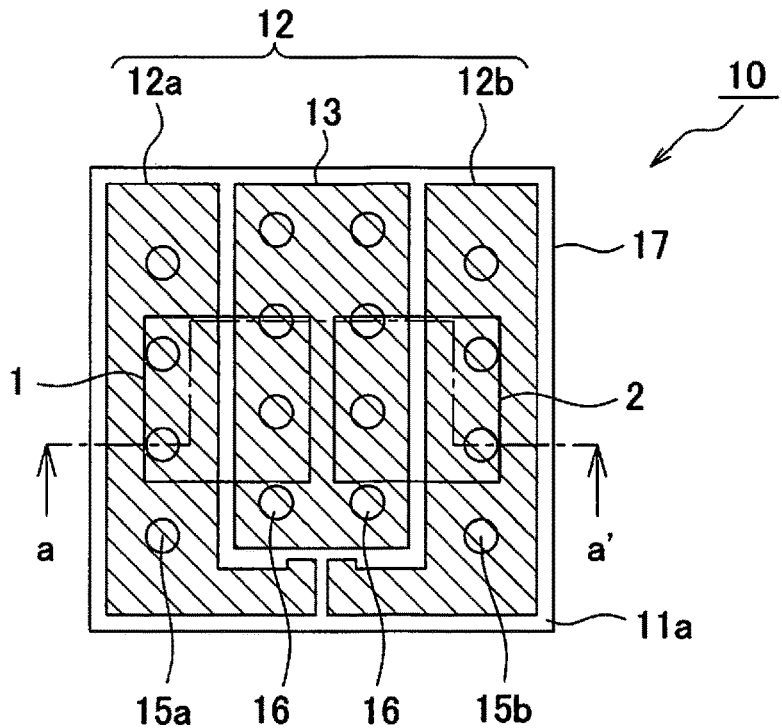
FIG. 1A is a schematic plan view of a light emitting device according to Embodiment 1.

In the present disclosure, the sizes of the members, their positional relationship, or the like, shown in the drawings might be exaggerated for clarity of explanations. In the explanations given below, moreover, the same designations and reference numerals indicate the components that are identical or of the same nature, for which the explanations will be omitted when appropriate.

Light Emitting Device

Figure 1B:
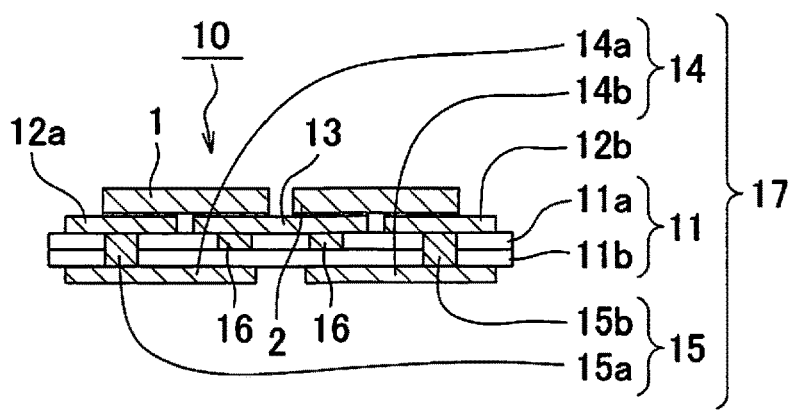
FIG. 1B is a schematic cross-sectional view taken along line a-a' of FIG. 1A.
Figure 1C:
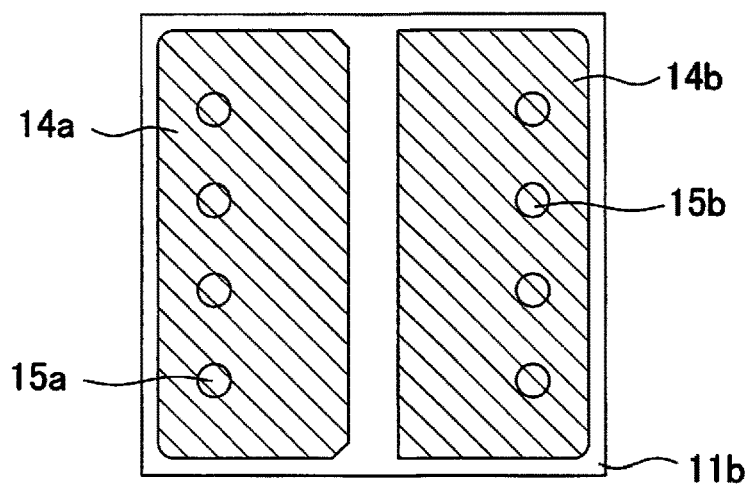
FIG. 1C is a back face view of the light emitting device according to Embodiment 1.

The light emitting device according to a certain embodiment of the present disclosure, as shown in FIGS. 1A-1C for example, includes a mounting board 17, and a first light emitting element 1 and a second light emitting element 2 both arranged on the mounting board 17. The first light emitting element 1 and the second light emitting element 2 are connected in series on the mounting board 17.

Mounting Board

A mounting board 17 includes: an insulator 11 including a front face and a back face, a pair of front face wiring parts 12 disposed on the front face of the insulator, a connection wiring part 13 disposed on the front face of the insulator and spaced apart from the front face wiring parts, a pair of back face terminals 14 disposed on the back face of the insulator, first interlayer wiring parts 15 penetrating the insulator and electrically connecting the front face wiring parts 12 and the back face terminals 14, and one or more second interlayer wiring parts 16 embedded in the insulator to be in contact with the connection wiring part, but spaced apart from the back face terminals. The wiring parts and the terminals described above might be collectively referred to as wiring members herein. The mounting board 17 can be used to mount a plurality of light emitting elements connected in series.

Insulator

For the insulator 11, for example, glass, glass epoxy, phenolic paper, epoxy paper, glass composite, low temperature co-fired ceramic (LTCC), thermoplastic resin, thermosetting resin, a ceramic such as alumina and aluminum nitride, or the like can be used. Specifically, a ceramic which is preferable due to its highly resistant to heat and weather.

The insulator 11 may be of a single insulating layer, or a multilayer of insulator composed of two or more insulating layers. Even in the case of a multilayer composed of two or more insulator layers, the insulator 11 composed of multiple ceramic layers is preferable.

The front face and/or back face of the insulator 11 are preferably flat. For example, the external shape of the insulator 11 is substantially a plate-like rectangular shape.

The thickness and the size of the insulator can be suitably adjusted depending on the size and the number of the light emitting elements to be mounted thereon. For example, the total thickness of the insulator can be in a range of about 0.1 mm to about 1.0 mm, and the size can be in a range of about 50 mm×50 mm to about 100 mm×100 mm.

Wiring Members

The wiring members are intended for electrically connecting the light emitting elements to an external power supply in order to apply voltage to the light emitting elements from the external power supply, or for transferring the heat away from the light emitting elements. The wiring members can be formed with a conductive material. For example, a single layer or multilayer film of a metal such as Au (gold), Ag (silver), Cu (copper), W (tungsten), or any of their alloys can be used. Specifically, copper or a copper alloy is preferable due to the heat dissipation standpoint.

The wiring members can be formed by using various methods that are known in the art, such as sputtering, vapor deposition, plating, or the like. The wiring members can be formed by combining these techniques depending on the site and the shape. The thickness of a wiring member can be the same in its entirety or different in part. For example, the thickness can be about in a range of 1 μm to 300 μm.

Front Face Wiring Parts, Connection Wiring Part, and Back Face Terminals

A plurality of front face wiring parts 12 are arranged on the front face of the insulator. For example, a pair of front face wiring parts 12a and 12b can be provided as the plurality of front face wiring parts 12. At least one connection wiring part 13 is disposed on the front face of the insulator while being spaced apart from the front face wiring parts. The pair of front face wiring parts 12a and 12b, and the connection wiring part 13 are preferably regularly arranged in one direction to dispose the light emitting elements in a row.

A plurality of back face terminals 14 intended for an external connection are provided for electrically connecting the light emitting device 10 to the outside, and are disposed on the back face of the insulator, which is the back face of the light emitting device 10. For example, a pair of back face terminals 14a and 14b are provided as the plurality of back face terminals 14. The pair of back face terminals 14a and 14b are preferably disposed to overlap the pair of front face wiring parts 12a and 12b in a plan view. This reduces the distance between the front face wiring parts 12 and the back face terminals 14, thereby enabling reduction in the lengths of the first interlayer wiring parts 15 discussed later.

For the front face wiring parts and the back face terminals, at least two each, i.e., a pair of positive and negative members, are sufficient, but more (e.g., multiple pairs) may be provided.

The connection wiring part is used as a relay wiring part to connect the light emitting elements in series. The number of connection wiring parts per one mounting board can be suitably adjusted depending on the number of light emitting elements to be mounted on the mounting board.

The plan view shapes of the front face wiring parts and the back face terminals can be suitably set depending on, for example, the number of light emitting elements, the shape of the light emitting device, or the like.

First Interlayer Wiring Parts and Second Interlayer Wiring Parts

The first interlayer wiring parts 15 and the second interlayer wiring parts 16 are embedded in the insulator 11, and at least a portion of each of the first interlayer wiring parts 15 and the second interlayer wiring parts 16 is exposed at the front face of the insulator.

The first interlayer wiring parts 15 penetrate the insulator 11, is in contact with, and electrically connecting the front face wiring parts 12 and the back face terminals 14.

The second interlayer wiring parts 16 are embedded in the insulator 11 to be in contact with the connection wiring part 13, but spaced apart from the back face terminals 14. It is sufficient to provide one second interlayer wiring part, but two or more are preferable. The number of the second interlayer wiring parts can be suitably adjusted depending on the number and the size of the light emitting elements. The second interlayer wiring parts are preferably regularly arranged in a plan view, more preferably arranged substantially symmetrically to the first interlayer wiring parts in an area that each of the light emitting elements is mounted. It is particularly preferable to arrange the first interlayer wiring parts and/or the second interlayer wiring parts in such a manner as to overlap the light emitting elements in a plan view when the light emitting elements are mounted on the mounting board. Such arrangement allows the interlayer wiring parts to contribute to efficiently drawing away heat from the light emitting elements.

The second interlayer wiring parts, moreover, are preferably arranged to overlap the back face terminals in a plan view. Such arrangement allows the heat generated from the light emitting elements to be efficiently transferred to the back face terminals via the second interlayer wiring parts.

The first interlayer wiring parts and the second interlayer wiring parts can each have an area as large as possible to the extent that the short circuit does not occur. The plan view shape of each of the first interlayer wiring parts and the second interlayer wiring parts can be suitably set as a circular, elliptical, or polygonal shape depending on the shapes of the front face wiring parts, the connection wiring part, and the back face terminals. The foregoing size and shapes can be set to take into account heat dissipation Specifically, a circular or elliptical shape in a range of 100 μm to 2000 μm in maximum width is preferable to achieve higher heat dissipation. Selecting such shape and size allows for the use of plating, for example, to efficiently and highly precisely produce the mounting boards, which can promote weight reduction at low cost.

For a higher heat dissipation effect, for example, the first interlayer wiring parts and the second interlayer wiring parts may have approximately the same areas as those of the front face wiring parts 12 and the connection wiring part 13.

Heat Dissipation Terminal

The mounting board 17 may further include a heat dissipation terminal 28 on the back face of the insulator 11. For example, as shown in FIG. 2B, the heat dissipation terminal 28 is spaced apart from the back face terminals 24 and the first interlayer wiring parts 25, i.e., electrically insulated from the light emitting elements. The shape, position, size, or the like of the heat dissipation terminal 28 can be suitably adjusted. The heat dissipation terminal 28 preferably overlaps the second interlayer wiring parts 26 in a plan view in order to efficiently play its role. This can increase the area of contact with the outside, thereby further improving heat dissipation. The heat dissipation terminal 28 is electrically insulated from the light emitting elements and the back face terminals, therefore for example, the heat dissipation terminal can be joined with a metal mounting board without an intervening insulating film when the light emitting device is mounted on the metal mounting board. Accordingly, heat dissipation is realized at a higher level.

Other Interlayer Wiring Parts

The mounting board 17 may have an additional interlayer wiring part. As an example, third interlayer wiring parts 29 shown in FIG. 2B are embedded in the insulator 21 to be in contact with the heat dissipation terminal 28, but spaced apart from the second interlayer wiring parts 26. As another example, fourth interlayer wiring parts 99 shown in FIG. 9B are embedded in the insulator 91 to be in contact with the back face terminals 94, but spaced apart from the first interlayer wiring parts 95 and the second interlayer wiring parts 96.

The shapes and the sizes of the third interlayer wiring parts and the fourth interlayer wiring parts can be the same or similar to those of the first interlayer wiring parts and the second interlayer wiring parts. By suitably providing third and/or fourth interlayer wiring parts in the mounting board 17, efficient heat dissipation can be realized due to less non-uniformity of heat dissipation effect across the light emitting device.

Layer Structure of Mounting Board

The mounting board 17 can be constructed using, for example, a stacked structure. Examples include: a four-layer structure composed of an insulator which is a stack of two insulator layers, and wiring parts disposed on the front and back faces of the insulator; a five-layer structure composed on an insulator which is a stack of three insulator layers, and wiring parts disposed on the front and back faces of the insulator; and a structure having six or more layers composed of an insulator which is a stack of four or more insulator layers, and wiring parts disposed on the front and back faces of the insulator. From the standpoint of mounting board thickness reduction and efficient formation of interlayer wiring parts, it is preferable to employ the insulator a stack of two or three insulator layers.

In any stacked structure, the first interlayer wiring parts penetrate the insulator, and are exposed at the front and back faces of the insulator. The second interlayer wiring parts and/or the third interlayer wiring parts and/or the fourth interlayer wiring parts are embedded in the holes that penetrate at least one of the insulator layers of the insulator, and are exposed at either the front face or the back face of the insulator.

Light Emitting Elements

The light emitting device includes a first light emitting element disposed to straddle one of the pair of front face wiring parts and the connection wiring part, and a second light emitting element disposed to straddle the other of the pair of front face wiring parts and the connection wiring part. In other words, a plurality of light emitting elements are mounted and connected in series on the mounting board surface between the pair of front face wiring parts. In the case where the light emitting device includes three or more light emitting elements, the mounting board 17 includes two or more connection wiring parts, where the first light emitting element and the second light emitting element are mounted using different connection wiring parts, while the third light emitting element is mounted straddling the two connection wiring parts used to mount the first light emitting element and the second light emitting element. By increasing the number of relaying connection wiring parts in this manner, three or more light emitting elements can be connected in series using the pair of front face wiring parts and the connection wiring parts positioned therebetween.

Light emitting elements that can be flip chip mounted on a mounting board are preferable. For example, one of the electrodes of the first light emitting element is connected to one of the pair of front face wiring parts, the other electrode is connected to the connection wiring part, one of the electrodes of the second light emitting element is connected to the connection wiring part, and the other electrode is connected to the other of the pair of front face wiring parts, each via a bonding member. In the case where three or more light emitting elements are mounted, the mounting board includes two or more connection wiring parts 13, and between the pair of front face wiring parts, the third light emitting element, the fourth light emitting element, and so on are connected to straddle two adjacent connection wiring parts, each via a bonding member.

The light emitting elements preferably have a pair of electrodes on the same side. For example, one of the pair of electrodes of the first light emitting element (e.g., the p-electrode) is connected to one of the front face wiring parts (e.g., the anode), and the other electrode (e.g., the n-electrode) is connected to the connection wiring part. One of the pair of electrodes of the second light emitting element (e.g., the p-electrode) is connected to the connection wiring part, and the other electrode (e.g., the n-electrode) is connected to the other front face wiring part (e.g., the cathode). In the case where the light emitting device includes three or more light emitting elements, the third light emitting element, the fourth light emitting element, and so on are arranged to straddle two of the two or more connection wiring parts disposed between one of the front face wiring part and the other of the front face wiring part. Specifically, one of the electrodes (e.g., the p-electrode) of such a light emitting element is connected to the connection wiring part closer to one of the front face wiring part (e.g., the anode) while the other electrode of the light emitting element (e.g., the n-electrode) is connected to the connection wiring part closer to the other of the front face wiring part (e.g., the cathode).

In other words, one electrode of a first light emitting element (e.g., the n-electrode) and one electrode of a second light emitting element (e.g., the p-electrode) are connected to a connection wiring part. For example, in the case where there is a large difference in the areas between the pair of electrodes of a light emitting element, the following arrangement can be employed as one preferable example. A large difference is provided between the area where the connection wiring part overlaps the first light emitting element and the area where the connection wiring part overlaps the second light emitting element. Then a larger number of second interlayer wiring parts is disposed immediately under the light emitting element having a larger connection area in a plan view than those disposed immediately under the other light emitting element. With such arrangement, the second interlayer wiring parts can more efficiently contribute to drawing away the heat generated by the light emitting element which is provided on a larger number of second interlayer wiring parts.

For the light emitting elements, a known light emitting diode chip can be used. Examples include those having a stacked structure which has an emission layer constructed on a substrate using various semiconductors, including nitride semiconductors such as InN, AlN, GaN, InGaN, AlGaN, and InGaAlN, Group III-V compound semiconductors, Group II-VI compound semiconductors, or the like. Examples of substrates include insulating substrates such as sapphire, and conductive substrates such as SiC, GaN, GaAs, or the like. However, light emitting elements do not ultimately need to include any substrate. In the case where a light emitting element includes an insulating substrate, moreover, a plurality of light emitting elements may be linked using a common insulating substrate.

Bonding Member

The bonding member is used to mount light emitting elements on a mounting board. The light emitting elements are preferably flip chip mounted on the mounting board. To bond the light emitting elements on the front face wiring parts of the mounting board, for example, the bonding member is disposed to be present at least between the electrodes of the light emitting elements and the front face wiring parts. For the bonding member, a material capable of electrically connecting the light emitting elements and the front face wiring parts is used. Examples of the bonding member include: solder containing tin-bismuth, tin-copper, tin-silver, or gold-tin, or the like; conductive paste or bumps containing gold, palladium, or the like; anisotropic conductive material; low melting point metal brazing material; or the like, can be used.

Phosphor Layer

The light emitting device is preferable to further include a phosphor layer that covers the light emitting elements.

The phosphor layer converts the light emitted by the light emitting elements into light of another wavelength. For example, the phosphor layer may be one that can convert the light from the light emitting elements into light having a shorter wavelength, but from the standpoint of light extraction efficiency, is preferable one that converts into light having a longer wavelength. The phosphor layer is disposed to cover at least the upper faces of the light emitting elements. Covering the light emitting elements with the phosphor layer allows for extraction of the light released from the light emitting elements into the phosphor layer once, thereby reducing the absorption of light within the light emitting elements.

Examples of phosphors for forming the phosphor layer include, in the case of employing blue light emitting elements or ultraviolet light emitting elements by way of example, those excitable by the emitted light from the light emitting elements. Specific examples thereof include cerium-activated yttrium aluminum garnet-based phosphors (YAG:Ce), cerium-activated lutetium aluminum garnet-based phosphors (LAG:Ce), europium- and/or chromium-activated nitrogen-containing calcium aluminosilicate-based phosphors ($CaO-Al_2O_3-SiO_2$:Eu), europium-activated silicate-based phosphors (($Sr,Ba)_2SiO_4$:Eu), nitride-based phosphors such as β-SiAlON phosphors, CASN-based phosphors, and SCASN-based phosphors, KSF-based phosphors ($K_2SiF_6$:Mn), sulfide-based phosphors, and quantum dot phosphors. By combining these phosphors with a blue or ultraviolet light emitting element, a light emitting device of a given emission color (e.g., a white light emitting device) can be produced.

The phosphor layer is usually formed on the upper faces of the light emitting elements after mounting the light emitting elements on the mounting board.

The phosphor layer can be formed by electrodeposition, electrostatic coating, potting, printing, spraying, or the like. Alternatively, a phosphor layer in the form of a plate or sheet having the shape corresponding to the outer shape of the light emitting elements can be placed on the light emitting elements.

The thickness of the phosphor layer can be suitably adjusted by the phosphor particle deposition method. The phosphor layer preferably covers the light emitting elements with a substantially uniform thickness. The phosphor layer preferably has a thickness of in a range of about 0.01 μm to about 100 μm.

Light Reflective Layer

The light emitting device preferably includes a light reflective layer disposed in the perimeters of the light emitting elements.

Examples of light reflective layers include those covering the upper faces of the front face wiring parts or those covering the lateral faces of the light emitting elements, which play a role of improving the light extraction efficiency.

The light reflective material that constructs the light reflective layer is preferably a material capable of efficiently reflecting the light emitted from the light emitting elements and the light whose wavelength has been converted by the phosphor layer, more preferably a material capable of reflecting at least 80%, even more preferably at least 90%, of the light at the peak wavelengths.

It is preferable to employ a material for the light reflective layer that does not readily transmit or absorb the light from the light emitting elements or the light whose wavelength has been converted by the phosphor layer. Furthermore, an insulating material is preferable.

Employing, for example, $SiO_2$, $TiO_2$, $ZrO_2$, $BaSO_4$, or MgO powder for the material to form the light reflective layer allows the layer to efficiently reflect light. These materials can be used singly or in combination of two or more. Typically, these materials are used in the form of being mixed in a resin employed in the art, such as a thermosetting or thermoplastic resin.

In the light emitting device described above, a lens or the like may be formed on the phosphor layer and/or the light reflective layer to cover over the light emitting elements using a light transmissive material formed by potting, compression molding, or transfer molding.

Certain embodiments of the light emitting device according to the present disclosure will be specifically explained below based on the accompanying drawings.

Embodiment 1

The light emitting device 10 according to Embodiment 1, as shown in FIGS. 1A to 1C, includes a mounting board 17, and a first light emitting element 1 and a second light emitting element 2 both disposed on the mounting board 17. The first light emitting element 1 and the second light emitting element 2 are mounted to be connected in series.

The mounting board 17 includes an insulator 11 which is a stack of two ceramic insulator layers 11a and 11b; a pair of front face wiring parts 12a and 12b and a connection wiring part 13 disposed on the front face of the insulator 11; a pair of back face terminals 14a and 14b disposed on the back face of the insulator 11; and first interlayer wiring parts 15a and 15b and a plurality of second interlayer wiring parts 16 embedded in the insulator 11.

The connection wiring part 13 is one of the outermost surfaces of the front face of the mounting board 17 being spaced apart and positioned between the pair of the front face wiring parts 12a and 12b.

The first interlayer wiring parts 15a penetrate the insulator 11 and electrically connect the front face wiring part 12a and the back face terminal 14a, while the first interlayer wiring parts 15b penetrate the insulator 11 and electrically connect the front face wiring part 12b and the back face terminal 14b.

The second interlayer wiring parts 16 are embedded in the insulator 11 while being in contact with the connection wiring part 13, but spaced apart from the back face terminals 14a and 14b. The second interlayer wiring parts 16 are embedded in the holes that penetrate the insulator layer 11a of the two insulator layers 11a and 11b that is positioned on the front face side. The second interlayer wiring parts 16 are each substantially columnar shaped, with the upper face contacting the connection wiring part 13 and the lateral and lower faces contacting the insulator 11.

The mounting board is substantially a flat sheet having a square outer shape in a plan view of 2.8×2.8 mm in size.

All of these front face wiring parts 12a and 12b, the connection wiring part 13, the back face terminals 14a and 14b, the first interlayer wiring parts 15a and 15b, and the second interlayer wiring parts 16 are formed of copper. Copper is highly thermally conductive and thus is suited for use as a heat dissipation member.

The insulator layers 11a and 11b each have a thickness of about 100 μm. The front face wiring parts 12a and 12b, the connection wiring part 13, and the back face terminals 14a and 14b each have a thickness of about 100 μm.

The first interlayer wiring parts 15a and 15b have the same thickness as the insulator 11, in other words, about 200 μm, and a circle of about 200 μm in diameter in a plan view. The first interlayer wiring parts 15a and 15b are disposed directly below the front face wiring parts 12a and 12b and directly on the back face terminals 14a and 14b in a plan view. The first interlayer wiring parts are preferably disposed at substantially equal intervals such that the thermal distribution in the light emitting device 10 is uniform, for example, in four rows and one column.

The second interlayer wiring parts 16 have a thickness of 100 μm, and a substantially circular shape of 200 μm in diameter in a plan view. The second interlayer wiring parts 16 are arranged, in a plan view, at equal intervals directly below the connection wiring part 13 and immediately above the back face terminals 14a and 14b, for example, in four rows and two columns.

The first and second light emitting elements 1 and 2 have substantially the same outer shapes, for example, each being 0.1×0.1 mm in size, having a pair of positive and negative electrodes on the same face, and flip chip mounted on the front face wiring parts 12 and the connection wiring part.

The first light emitting element 1 is disposed to straddle the front face wiring part 12a, which is one of the pair of front face wiring parts 12, and the connection wiring 13, while being positioned immediately above one or more first interlayer wiring parts 15a and one or more second interlayer wiring parts 16.

The second light emitting element 2 is disposed to straddle the front face wiring part 12b, which is the other of the pair of front face wiring parts 12, and the connection wiring 13, while being positioned immediately above one or more first interlayer wiring parts 15b and one or more second interlayer wiring parts 16.

By providing the second interlayer wiring parts in contact with the connection wiring part in this manner, a portion of the heat generated by the light emitting elements can be transferred from the connection wiring part to the second interlayer wiring parts, and the uneven heat dissipation can be moderated. This results in more uniform heat dissipation, thereby improving the heat dissipation effect of the overall light emitting elements and reducing the deterioration of the light emitting elements attributable to localized heat in the light emitting elements.

In the case where the first interlayer wiring parts are arranged to overlap the light emitting elements in a plan view and/or the second interlayer wiring parts arranged to overlap the light emitting elements in a plan view, in particular, the heat generated by the light emitting elements can be dissipated from the front face side of the mounting board to the back face side using the shortest heat dissipation paths without causing short circuits for the light emitting elements connected in series. Thus, the effect described above can be even further improved.

Embodiment 2

The light emitting device 20 according to Embodiment 2, as shown in FIGS. 2A to 2C, includes at least a mounting board 27, and a first light emitting element 1 and a second light emitting element 2 both arranged on the mounting board 27. The first light emitting element 1 and the second light emitting element 2 are mounted to be connected in series.

The mounting board 27 differs from that of the light emitting device according to Embodiment 1 in that a heat dissipation terminal 28 and third interlayer wiring parts 29 are included in addition to an insulator 21 which is a stack of two insulator layers 21a and 21b, a pair of front face wiring parts 22a and 22b, a connection wiring part 23, a pair of back face terminals 24a and 24b, first interlayer wiring parts 25a and 25b, and second interlayer wiring parts 26.

The heat dissipation terminal 28 is disposed on the back face of the insulator 21, and spaced apart from the back face terminals 24a and 24b as well as the second interlayer wiring parts 26. The heat dissipation terminal 28 is positioned between the pair of back face terminals 24a and 24b on the back face of the insulator 21.

The third interlayer wiring parts 29 are embedded in the insulator 21 to be in contact with the heat dissipation terminal 28, but spaced apart from the second interlayer wiring parts 26. The third interlayer wiring parts are embedded in the holes that penetrate the insulator layer 21b of the two insulator layers 21a and 21b that is located on the back face side. The third interlayer wiring parts 29 are each substantially columnar in shape, with the upper and lateral faces contacting the insulator 21, and the lower face contacting the heat dissipation terminal 28. The third interlayer wiring parts 29 do not overlap the second interlayer wiring parts 26 in a plan view. In the two insulator layers of the insulator 21, the second interlayer wiring parts 26 penetrate an insulator layer different to the insulator layer that the third interlayer wiring parts 29 penetrates.

The other configurations are effectively the same or similar to those of the light emitting device 10.

The light emitting device 20 configured as above has the same or similar effect to that achieved by the light emitting device 10.

The light emitting device 20 according to Embodiment 2, in particular, additionally includes the heat dissipation terminal on the back face side of the insulator, and the third interlayer wiring parts connected to the heat dissipation terminal and electrically insulated from the light emitting elements. Hence the heat transferred from the connection wiring part to the second interlayer wiring parts can be more readily dissipated towards the back face via the third interlayer wiring parts and the heat dissipation terminal. The heat dissipation effect thus can be further improved.

Embodiment 3

Figure 3A:
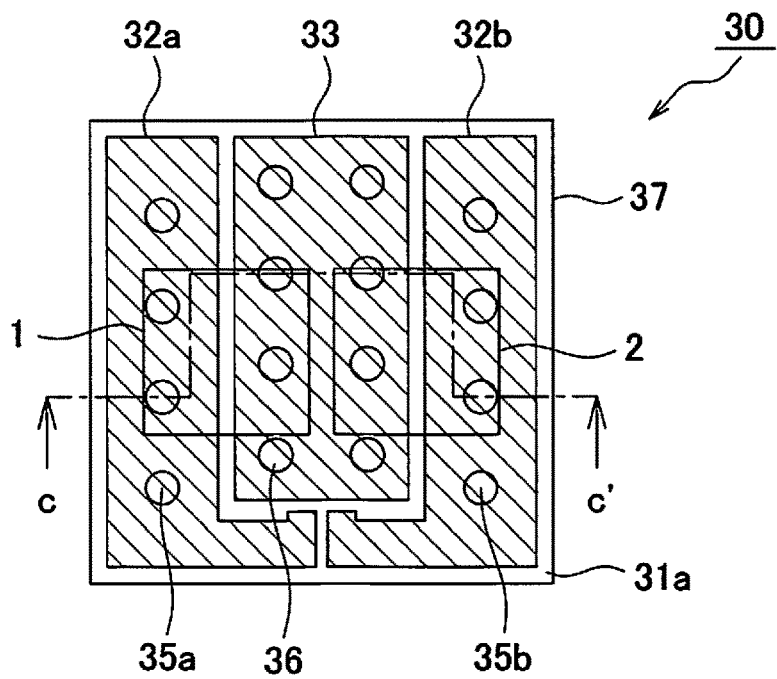
FIG. 3A is a schematic plan view of a light emitting device according to Embodiment 3.
Figure 3B:
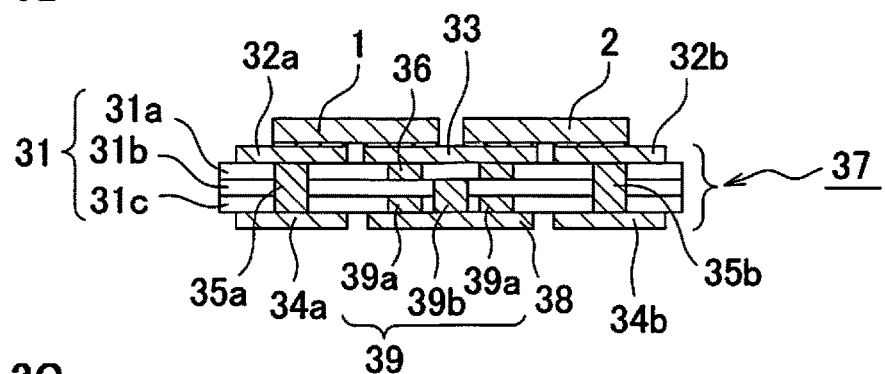
FIG. 3B is a schematic cross-sectional view taken along line c-c' of FIG. 3A.
Figure 3C:
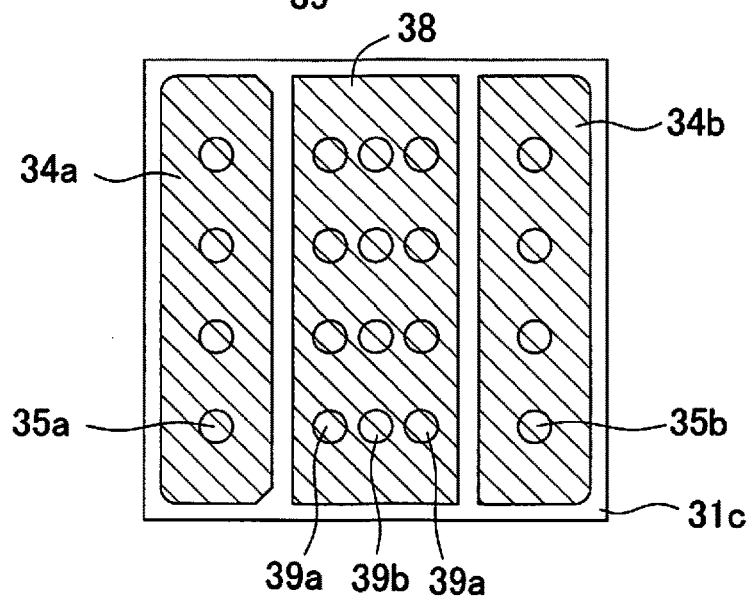
FIG. 3C is a back face view of the light emitting device according to Embodiment 3.

The light emitting device 30 according to Embodiment 3, as shown in FIG. 3A to 3C, includes at least a mounting board 37, and a first light emitting element 1 and a second light emitting element 2 both arranged on the mounting board 37. The first light emitting element 1 and the second light emitting element 2 are mounted to be connected in series.

The mounting board 37 includes a heat dissipation terminal 38 and third interlayer wiring parts 39 in addition to an insulator 31 which is a stack of three insulator layers 31a, 31b, and 31c, a pair of front face wiring parts 32a and 32b, a connection wiring part 33, a pair of back face terminals 34a and 34b, first interlayer wiring parts 35a and 35b, and second interlayer wiring parts 36.

The light emitting device 30 according to Embodiment 3 differs from the light emitting device 20 according to Embodiment 2 by having the insulator 31 that is a stack of three insulator layers.

The third interlayer wiring parts 39 are arranged in columns substantially in the center of the heat dissipation terminal 38 in a plan view. The third interlayer wiring parts 39 are embedded in the insulator 31 to be in contact with the heat dissipation terminal 38, but spaced apart from the second interlayer wiring parts 36. Among the three insulator layers 31a, 31b, and 31c, the third interlayer wiring parts 39 are embedded in the holes that penetrate the insulator layer 31c that structures the back face.

The third interlayer wiring parts 39a are arranged in columns on both sides of the third interlayer wiring parts 39b in a plan view, and in contact with the heat dissipation terminal 38. The third interlayer wiring parts 39 are spaced apart from the back face terminals 34a and 34b, the front face wiring parts 32a and 32b, and the connection wiring part 36. In other words, the third interlayer wiring parts 39 are electrically insulated from the first light emitting element 1 and the second light emitting element 2.

In this embodiment, the third interlayer wiring parts 39a which overlap the second interlayer wiring parts 36 in a plan view are provided in addition to the third interlayer wiring parts 39b which do not overlap the second interlayer wiring parts 36 in a plan view. Moreover, the third interlayer wiring parts 39b which do not overlap the second interlayer wiring parts 36 are embedded in the holes that penetrate the two back face side insulator layers 31b and 31c among the three insulator layers 31a, 31b, and 31c.

The other configuration are effectively the same or similar to those of the light emitting device 10 or 20.

The light emitting device 30 configured as above has the same or similar effect to that achieved by the light emitting device 10 or 20.

The light emitting device according to Embodiment 3, in particular, additionally includes the third interlayer wiring parts 39b which are longer than the second interlayer wiring parts 36, and/or the third interlayer wiring parts 39a located immediately under the second interlayer wiring parts 36, the heat dissipation to the back face can be further improved.

Embodiment 4

The light emitting device 40 according to Embodiment 4, as shown in FIG. 4A to 4C, includes at least a mounting board 47, and a first light emitting element 1 and a second light emitting element 2 both arranged on the mounting board 47. The first light emitting element 1 and the second light emitting element 2 are mounted to be connected in series.

The mounting board 47 includes a heat dissipation terminal 48 and third interlayer wiring parts 49 in addition to an insulator 41 which is a stack of three insulator layers 41a, 41b, and 41c, a pair of front face wiring parts 42a and 42b, a connection wiring part 43, a pair of back face terminals 44a and 44b, first interlayer wiring parts 45a and 45b, and second interlayer wiring parts 46.

The light emitting device 40 according to Embodiment 4 differs from the light emitting device 30 according to Embodiment 3 in that the second interlayer wiring parts and the third interlayer wiring part are both embedded in the middle insulator layer among the three insulator layers.

The second interlayer wiring parts 46 are embedded in the holes that penetrate two insulator layers 41a and 41b at the front face side among the three insulator layers 41a, 41b, and 41c in the insulator 41.

The third interlayer wiring parts 49 are embedded in the holes that penetrate two insulator layers 41b and 41c at the back face side among the three insulator layers 41a, 41b, and 41c in the insulator 41. The third interlayer wiring parts 49 are arranged in a column at the center of the heat dissipation terminal 48, and in contact with the heat dissipation terminal 48.

The other configurations are effectively the same or similar to those of the light emitting device 10 or 30.

The light emitting device 30 configured as above has the same or similar effect to that achieved by the light emitting device 10 or 30.
The light emitting device 40 according to Embodiment 4, in particular, includes the insulator 41 with the insulator layer in which both the second interlayer wiring parts 46 and the third interlayer wiring parts 49 are embedded, the heat is more readily transferred from the second interlayer wiring parts 46 to the third interlayer wiring parts 49. Thus, heat dissipation to the back face can be further improved.

Embodiment 5

Figure 5A:
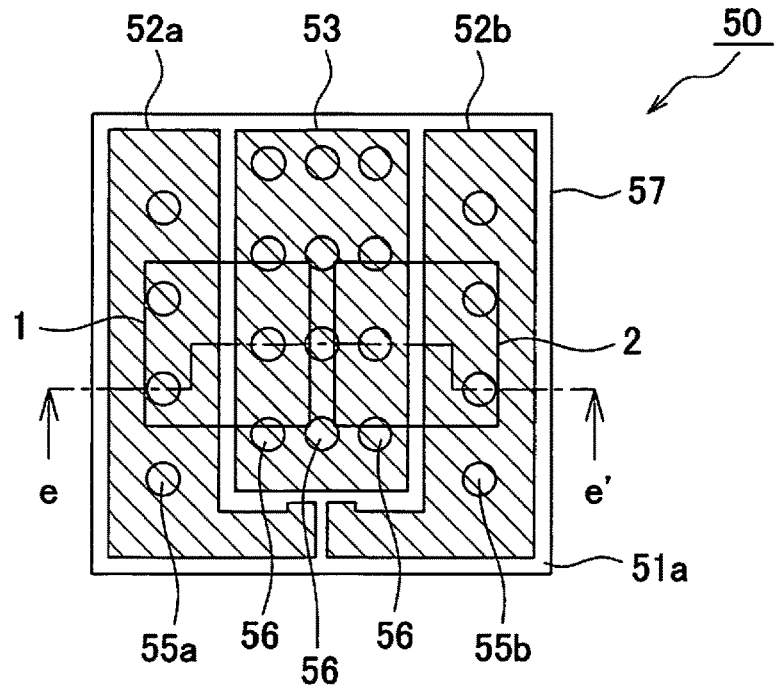
FIG. 5A is a schematic plan view of a light emitting device according to Embodiment 5.
Figure 5B:
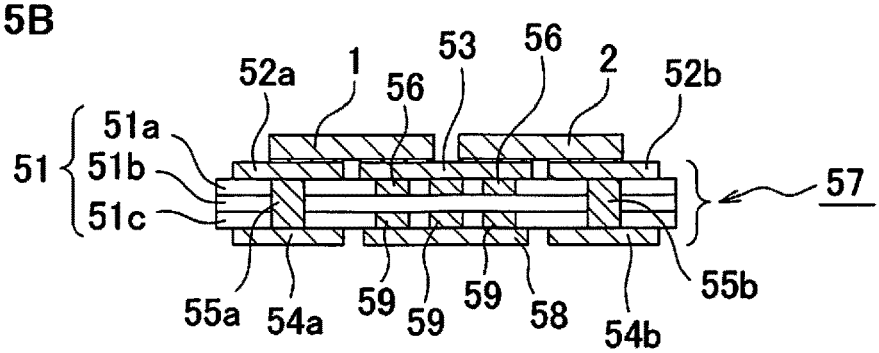
FIG. 5B is a schematic cross-sectional view taken along line e-e' of FIG. 5A.
Figure 5C:
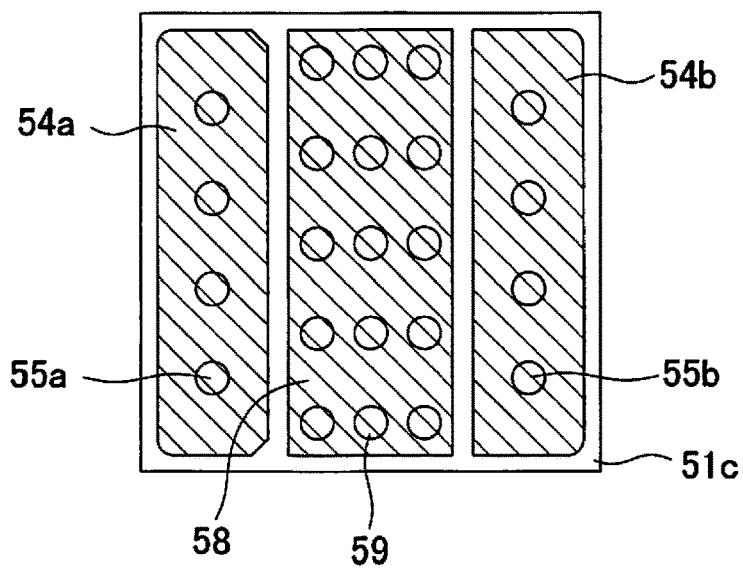
FIG. 5C is a back face view of the light emitting device according to Embodiment 5.

The light emitting device 50 according to Embodiment 5, as shown in FIG. 5A to 5C, includes, at least a mounting board 57, and a first light emitting element 1 and a second light emitting element 2 both arranged on the mounting board 57. The first light emitting element 1 and the second light emitting element 2 are mounted to be connected in series.

The mounting board 57 includes a heat dissipation terminal 58 and third interlayer wiring parts 59 in addition to an insulator 51 which is a stack of three insulator layers 51a, 51b, and 51c, a pair of front face wiring parts 52a and 52b, a connection wiring part 53, a pair of back face terminals 54a and 54b, first interlayer wiring parts 55a and 55b, and second interlayer wiring parts 56.

The light emitting device 50 according to Embodiment 5 differs from the light emitting device 30 according to Embodiment 3 in that the second interlayer wiring parts and the third interlayer wiring parts are not embedded in the middle insulator layer among the three insulator layers.

The second interlayer wiring parts 56 are embedded in the holes that penetrate the insulator layer 51a among the three insulator layers 51a, 51b, and 51c that configures the front face of the insulator 51. The second interlayer wiring parts 56 include the second interlayer wiring parts 56 that are arranged in columns in the area that includes those immediately under the first light emitting element 1 and/or the second light emitting element 2.

The third interlayer wiring parts 59 are embedded in the holes that penetrate the insulator layer 51c among the three insulator layers 51a, 51b, and 51c that configures the back face of the insulator 51. The third interlayer wiring parts 59 are immediately under, but not in contact with the second interlayer wiring parts 56. In other words, the third interlayer wiring parts 59 and the second interlayer wiring parts 56 overlap in a plan view.

The other configurations are effectively the same or similar to those of the light emitting device 10 or 30.

The light emitting device 50 configured as above has the same or similar effect to that achieved by the light emitting device 10 or 30.

The light emitting device 50 according to Embodiment 5 has a configuration that the third interlayer wiring parts 59 overlaps the second interlayer wiring parts 56 in a plan view, heat dissipation to the back face can be further improved. Moreover, the insulator layer 51b being a smaller thickness positioned in the middle than the insulator layer 51a which is the front face of the insulator 51 and the insulator layer 51c which is the back face of the insulator 51 can reduce the distance between the second interlayer wiring parts and the third interlayer wiring parts, thereby further improving the heat dissipation to the back face.

Embodiment 6

Figure 6A:
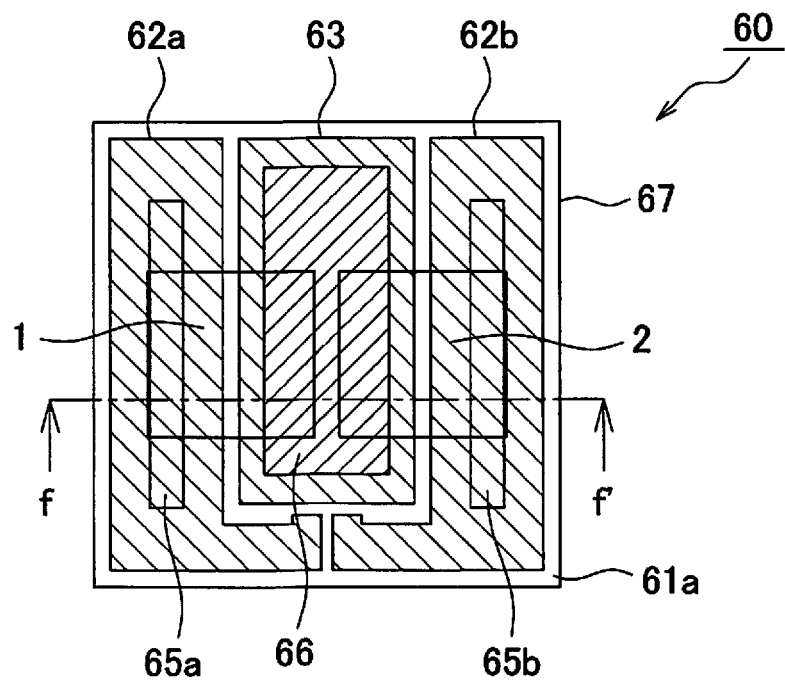
FIG. 6A is a schematic plan view of a light emitting device according to Embodiment 6.
Figure 6B:
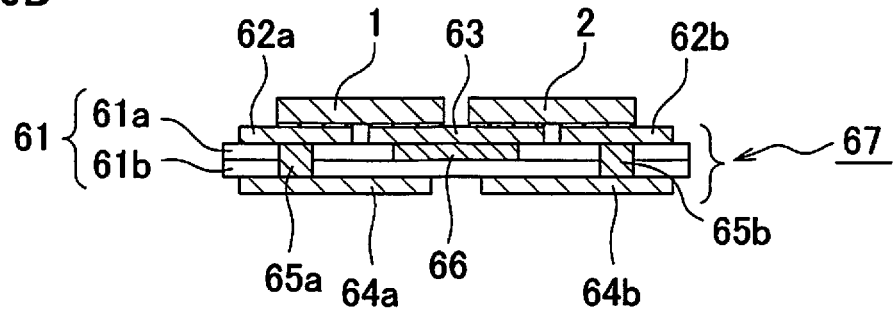
FIG. 6B is a schematic cross-sectional view taken along line f-f of FIG. 6.
Figure 6C:
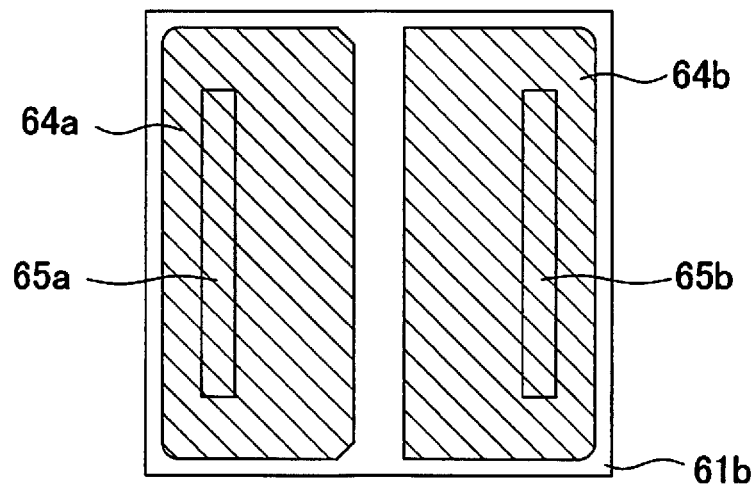
FIG. 6C is a back face view of the light emitting device according to Embodiment 6.

The light emitting device 60 according to Embodiment 6, as shown in FIG. 6A to 6C, includes a mounting board 67, and a first light emitting element 1 and a second light emitting element 2 both arranged on the mounting board 67. The first light emitting element 1 and the second light emitting element 2 are mounted to be connected in series.

The mounting board 67 includes an insulator 61 which is a stack of two insulator layers 61a and 61b, a pair of front face wiring parts 62a and 62b, a connection wiring part 63, a pair of back face terminals 64a and 64b, first interlayer wiring parts 65a and 65b, and a second interlayer wiring part 66.

The light emitting device 60 according to Embodiment 6 differs from the light emitting device 10 according to Embodiment 1 in that the first interlayer wiring parts and the second interlayer wiring part are substantially rectangular in shape in a plan view.

The first interlayer wiring parts 65a and 65b are each substantially rectangular in shape and 200 μm×1850 μm in size in a plan view. The first interlayer wiring parts 65a and 65b penetrate the insulator 61 and respectively electrically connect the front face wiring parts 62a and 62b and the back face terminals 64a and 64b. The first interlayer wiring parts 65a and 65b, one each, are disposed directly below the front face wiring parts 62a and 62b, and directly on the back face terminals 64a and 64b, respectively.

The second interlayer wiring part 66 is substantially rectangular in shape and 750 μm×1850 μm in size in a plan view.

The second interlayer wiring part 66 is embedded in the hole that penetrates the insulator layer 61a serving as the front face of the insulator 61 that is configured with the two insulator layers 61a and 61b. In a plan view, the second interlayer wiring part 66 is disposed directly below the connection wiring part 63 in its entirety, and partly immediately above the back face terminals 64a and 64b.

The other configurations are effectively the same or similar to those of the light emitting device 10.

The light emitting device 60 configured as above has the same or similar effect to that achieved by the light emitting device 10.

The light emitting device 60 according to Embodiment 6 has, in particular, an increased area of the second interlayer wiring part disposed to overlap the light emitting elements, heat dissipation to the back face can be further improved.

Embodiment 7

The light emitting device 70 according to Embodiment 7, as shown in FIG. 7A to 7C, includes a mounting board 77, and a first light emitting element 1, a second light emitting element 2, and a third light emitting element 3 all arranged on the mounting board 77. The first light emitting element 1, a second light emitting element 2, and a third light emitting element 3 are mounted to be connected in series.

The mounting board 77 includes an insulator 71 which is a stack of two insulator layers 71a and 71b, a pair of front face wiring parts 72a and 72b, a plurality of connection wiring parts 73 disposed between the front face wiring parts 72a and 72b, a pair of back face terminals 74a and 74b, first interlayer wiring parts 75a and 75b, and second interlayer wiring parts 76.

The light emitting device 70 according to Embodiment 7 differs from the light emitting device 10 according to Embodiment 1 by including three light emitting elements and two connection wiring parts for connecting the three light emitting elements in series.

The second interlayer wiring parts 76 are embedded in the holes that penetrate the insulator layer 71a located on the front face side of the two insulator layers 71a and 71b of the insulator 71. The upper face and the lower face of each second interlayer wiring part 76 are respectively in contact with the connection wiring part 73 and the insulator 71. In a plan view, the second interlayer wiring parts 76 are arranged at equal intervals, for example, in four rows and two columns, directly under each of the connection wiring parts 73, and directly above the back face terminal 74a or 74b.

The other configurations are effectively the same or similar to those of the light emitting device 10.

The light emitting device 70 configured as above has the same or similar effect to that achieved by the light emitting device 10.

Embodiment 8

Figure 8A:
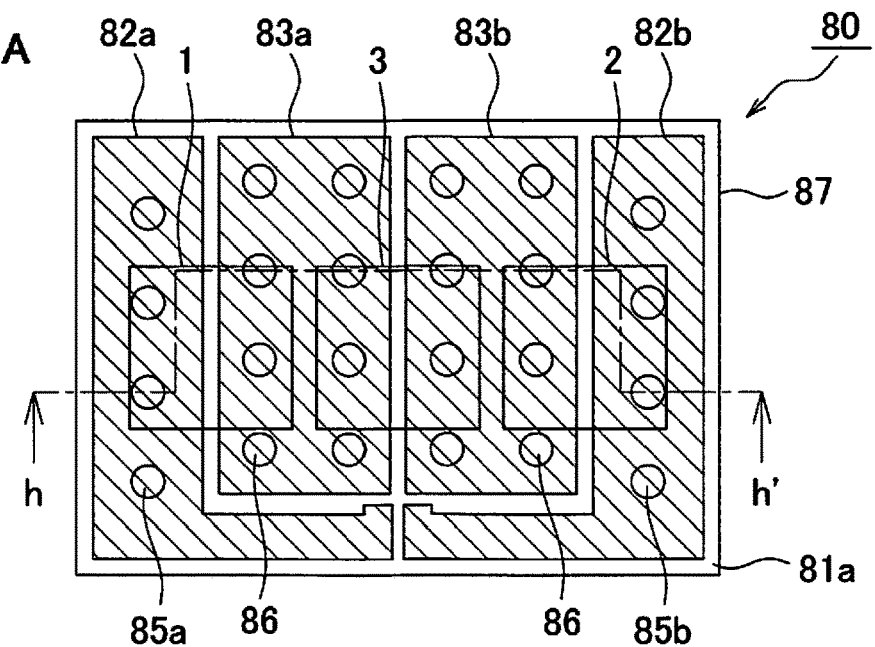
FIG. 8A is a schematic plan view of a light emitting device according to Embodiment 8.
Figure 8B:
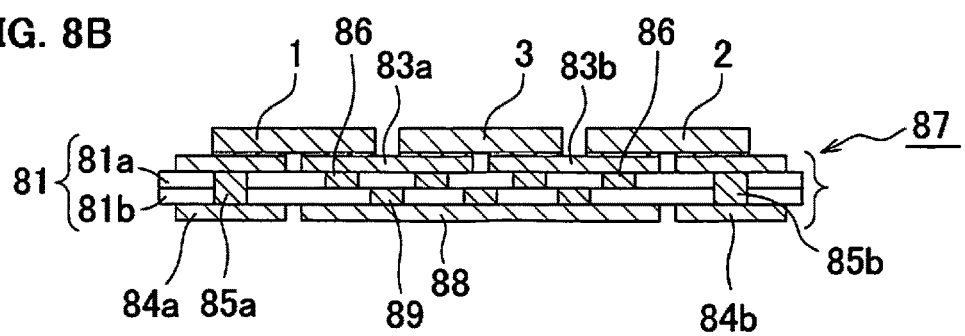
FIG. 8B is a schematic cross-sectional view taken along line h-h' of FIG. 8.
Figure 8C:
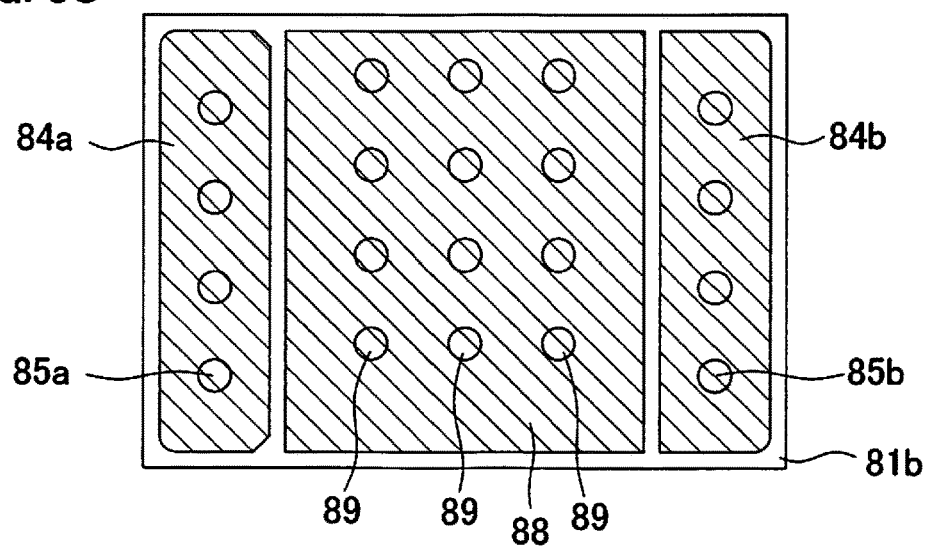
FIG. 8C is a back face view of the light emitting device according to Embodiment 8.

The light emitting device 80 according to Embodiment 8, as shown in FIG. 8A to 8C, includes a mounting board 87, and a first light emitting element 1, a second light emitting element 2, and a third light emitting element 3 all arranged on the mounting board 87. The first light emitting element 1, a second light emitting element 2, and a third light emitting element 3 are mounted to be connected in series.

The mounting board 87 includes a heat dissipation terminal 88 and third interlayer wiring parts 89 in addition to an insulator 81 which is a stack of two insulator layers 81a and 81b, a pair of front face wiring parts 82a and 82b, connection wiring parts 83a and 83b, a pair of back face terminals 84a and 84b, first interlayer wiring parts 85a and 85b, and second interlayer wiring parts 86.

The light emitting device 80 according to Embodiment 8 differs from the light emitting device 20 according to Embodiment 2 by including three light emitting elements and two connection wiring parts for connecting the three light emitting elements in series.

The other configurations are effectively the same or similar to those of the light emitting device 10 or 20.

The light emitting device 80 configured as above has the same or similar effect to that achieved by the light emitting device 10 or 20.

The light emitting device 80 according to Embodiment 8, in particular, includes the heat dissipation terminal on the back face side of the insulator, and further includes the third interlayer wiring parts connected to but electrically insulated from the heat dissipation terminal. This allows heat to more readily dissipate to the back face transferring from the connection wiring part to the second interlayer wiring parts via the third interlayer wiring parts, as well as enables moderate of the uneven temperature distribution in the light emitting elements.

Embodiment 9

Figure 9A:
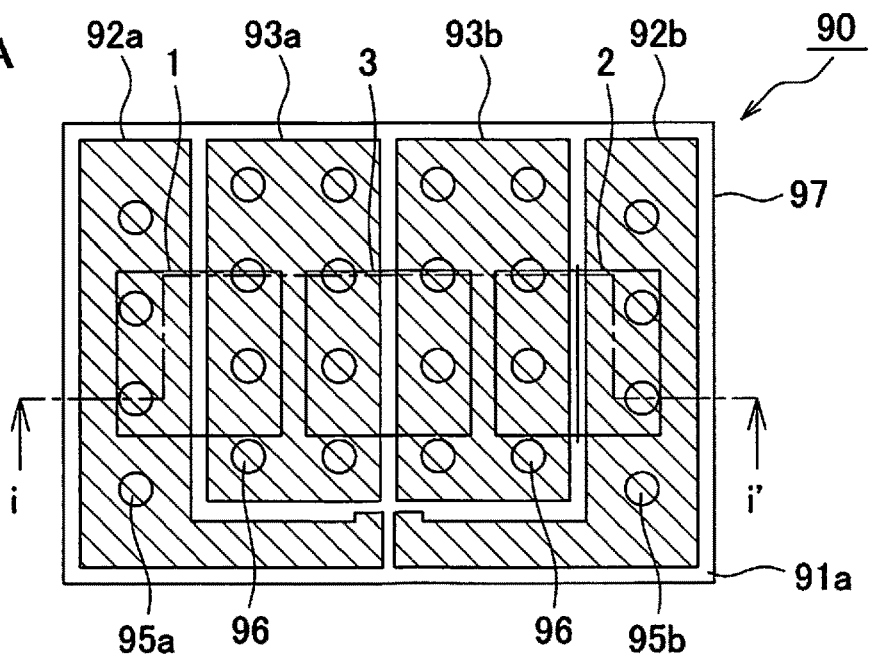
FIG. 9A is a schematic plan view of a light emitting device according to Embodiment 9.
Figure 9B:
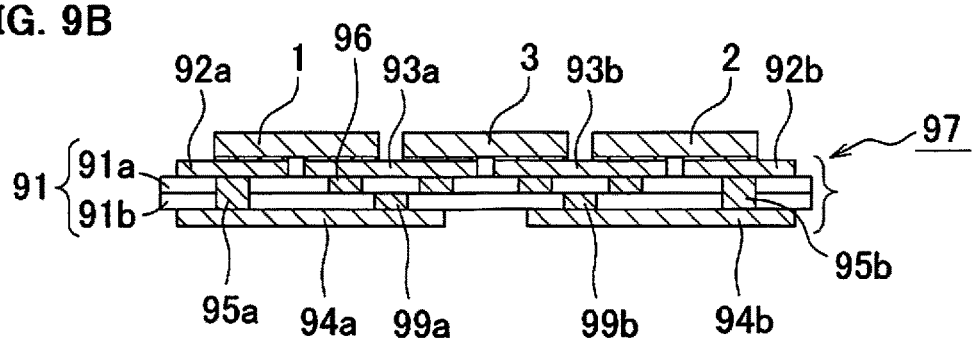
FIG. 9B is a schematic cross-sectional view taken along line i-i' of FIG. 9.
Figure 9C:
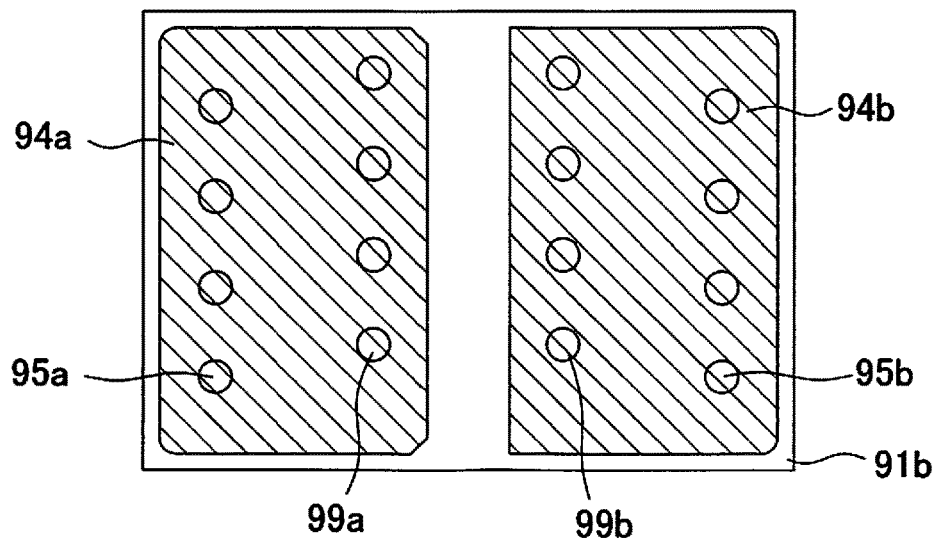
FIG. 9C is a back face view of the light emitting device according to Embodiment 9.

The light emitting device 90 according to Embodiment 9, as shown in FIG. 9A to 9C, includes a mounting board 97, and a first light emitting element 1, a second light emitting element 2, and a third light emitting element 3 all arranged on the mounting board 97. The first light emitting element 1, a second light emitting element 2, and a third light emitting element 3 are mounted to be connected in series.

The mounting board 97 differs from the mounting board 77 of the light emitting device 70 according to Embodiment 7 by having fourth interlayer wiring parts 99a and 99b in addition to an insulator 91 which is a stack of two insulator layers 91a and 91b, a pair of front face wiring parts 92a and 92b, connection wiring parts 93a and 93b, a pair of back face terminals 94a and 94b, first interlayer wiring parts 95a and 95b, and second interlayer wiring parts 96a and 96b.

The fourth interlayer wiring parts 99a and 99b are embedded in the holes that penetrate the insulator layer 91b positioned on the back face side of the two insulator layers 91a and 91b. The fourth interlayer wiring parts 99a and 99b are embedded in the insulator 91 to be respectively in contact with the back face terminals 94a and 94b, and spaced apart from the second interlayer wiring parts 96. In a plan view, the fourth interlayer wiring parts 99a and 99b are arranged at equal intervals, for example, in four rows and one column, at respective locations between the second interlayer wiring parts 96a and between interlayer wiring parts 96b immediately under the connection wiring parts 93a and 93b and directly on the back face terminals 94a and 94b. The fourth interlayer wiring parts 99 are each columnar in shape, with the upper and lateral faces being in contact with the insulator 91 and the lower face being in contact with one of the back face terminal 94.

The light emitting device 90 according to Embodiment 9 differs from the light emitting device 70 according to Embodiment 7 by including the fourth interlayer wiring parts.

The other configurations are effectively the same or similar to those of the light emitting device 10 or 70.

The light emitting device 90 according to Embodiment 9, in particular, includes the fourth interlayer wiring parts connected to the back face terminals. This allows for the heat transferred from the connection wiring part to the second interlayer wiring parts to be more readily transferred to the back face via the fourth interlayer wiring parts, as well as moderating the uneven temperature distribution in the light emitting elements.

Embodiment 10

Figure 10A:
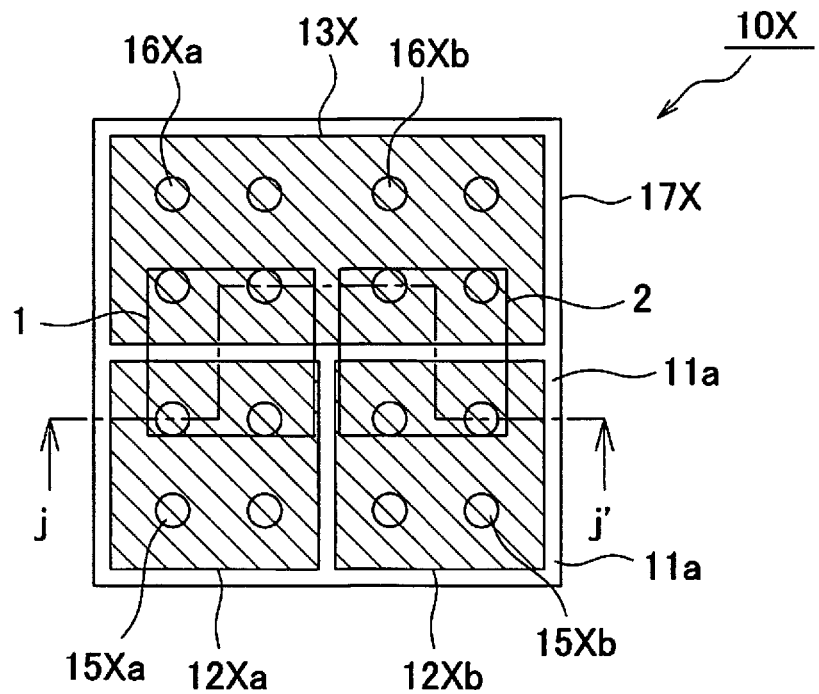
FIG. 10A is a schematic plan view of a light emitting device according to Embodiment 10.
Figure 10B:
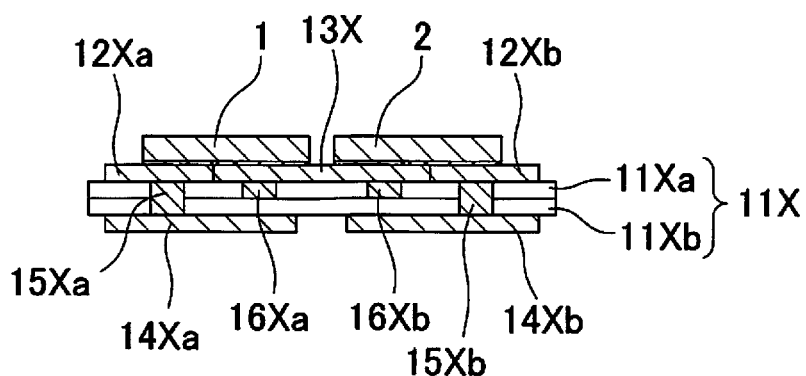
FIG. 10B is a schematic cross-sectional view taken along line j-j' of FIG. 10.
Figure 10C:
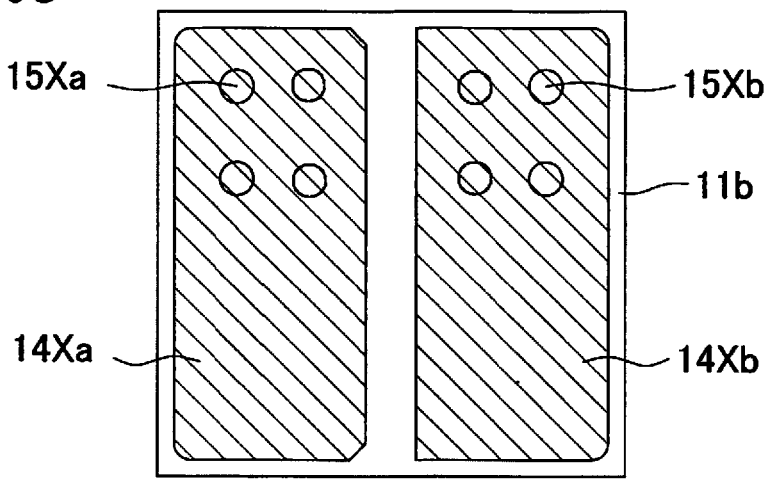
FIG. 10C is a back face view of the light emitting device according to Embodiment 10.

The light emitting device 10X according to Embodiment 10, as shown in FIG. 10A to 10C, includes a mounting board 17X, and a first light emitting element 1 and a second light emitting element 2 both arranged on the mounting board 17X. The first light emitting element 1 and the second light emitting element 2 are mounted to be connected in series.

The mounting board 17X has an insulator 11X which is a stack of two insulator layers 11Xa and 11Xb, a pair of front face wiring parts 12Xa and 12Xb, a connection wiring part 13X that is adjacent to both of the pair of front face wiring parts 12Xa and 12Xb, a pair of back face terminals 14Xa and 14Xb, first interlayer wiring parts 15Xa and 15Xb, and second interlayer wiring parts 16Xa and 16Xb.

The light emitting device 10X according to Embodiment 10 differs from the light emitting device 10 according to Embodiment 1 in that the connection wiring part 13X is not disposed between the pair of front face wiring parts 12Xa and 12Xb.

In this embodiment, the pair of front face wiring parts 12Xa and 12Xb are arranged adjacent each other, and the connection wiring part 13X is adjacent to both of the front face wiring parts 12Xa and 12Xb.

In a plan view, the first interlayer wiring parts 15Xa and 15Xb are arranged at equal intervals, for example in two rows and two columns, directly below the front face wiring parts 12Xa and 12Xb, respectively, and directly on the back face terminals 14Xa and 14Xb.

In a plan view, the second interlayer wiring parts 16Xa and 16Xb are arranged at equal intervals, for example in two rows and four columns, directly below the connection wiring part 13X and directly above the back face terminals 14Xa and 14Xb.

The other configurations are effectively the same or similar to those of the light emitting device 10.

The light emitting device 10X configured as above has the same or similar effect to that achieved by the light emitting device 10.

Embodiment 11

Figure 11A:
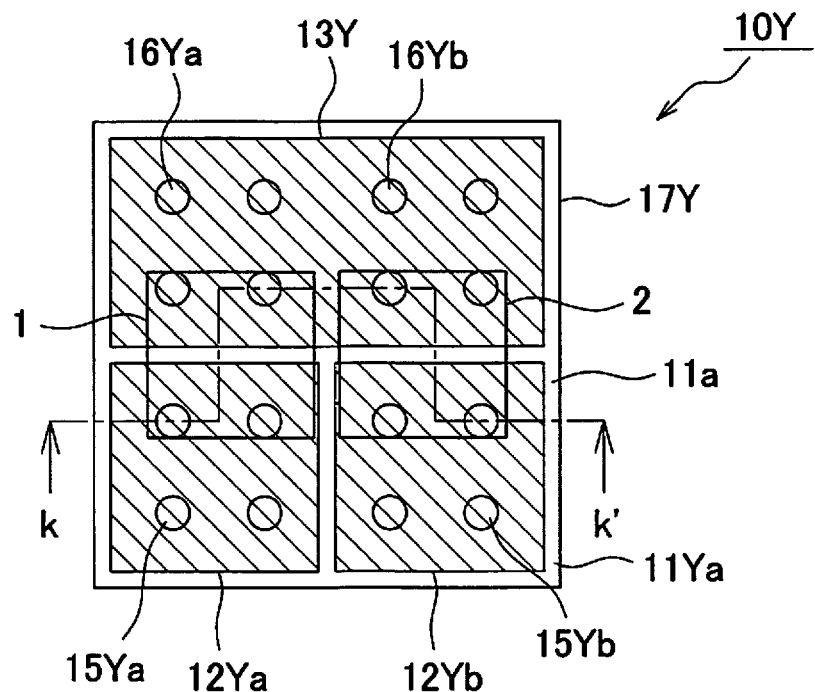
FIG. 11A is a schematic plan view of a light emitting device according to Embodiment 11.
Figure 11B:
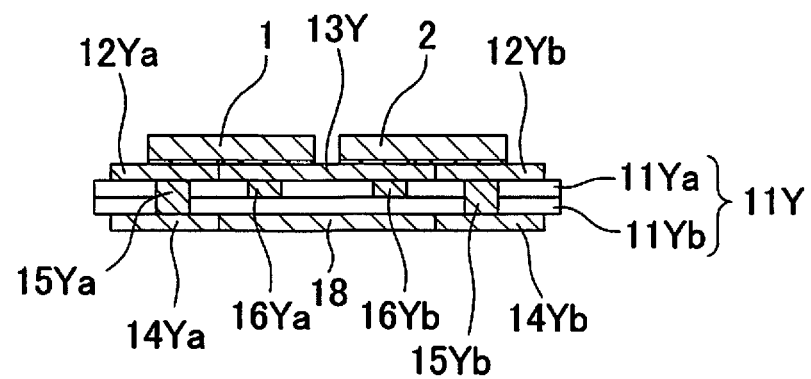
FIG. 11B is a schematic cross-sectional view taken along line k-k' of FIG. 11.
Figure 11C:
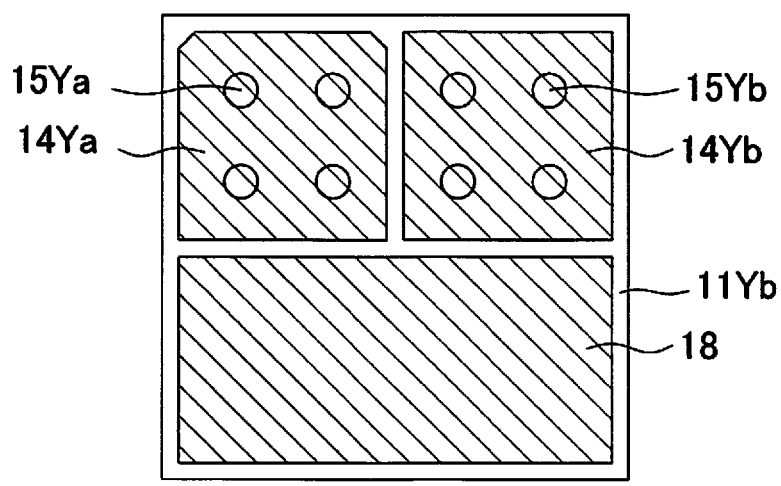
FIG. 11C is a back face view of the light emitting device according to Embodiment 11.

The light emitting device 10Y according to Embodiment 11, as shown in FIG. 11A to 11C, includes a mounting board 17Y, and a first light emitting element 1 and a second light emitting element 2 both arranged on the mounting board 17Y. The first light emitting element 1, a second light emitting element 2 are mounted to be connected in series.

The mounting board 17Y differs from that in the light emitting device 10X according to Embodiment 10 by having a heat dissipation terminal 18 in addition to an insulator 11Y which is a stack of two insulator layers 11Ya and 11Yb, a pair of front face wiring parts 12Ya and 12Yb adjacent to one another, a connection wiring part 13Y, a pair of back face terminals 14Ya and 14Yb, first interlayer wiring parts 15Ya and 15Yb, and second interlayer wiring parts 16Ya and 16Yb.

The heat dissipation terminal 18 is disposed on the back face of the insulator layer 11Yb to be adjacent to both of the pair of back face terminals 14Ya and 14Yb.

The second interlayer wiring parts 16Ya and 16Yb are disposed to overlap the heat dissipation terminal 18 in a plan view.

The connection wiring part 13Y is disposed to overlap the heat dissipation terminal 18 in a plan view.

The other configurations are effectively the same or similar to those of the light emitting device 10 or 10X.

The light emitting device 10Y configured as above has the same or similar effect to that achieved by the light emitting device 10 or 10X.

The light emitting device 10Y according to Embodiment 11, in particular, includes the heat dissipation terminal on the back face of the insulator. This enables heat dissipation more readily from the back face side through the heat dissipation terminal by transferring from the connection wiring part to the second interlayer wiring parts, thereby achieving even more uniform heat dissipation.

Embodiment 12

The light emitting device 100 according to this embodiment, as shown in FIGS. 12A to 12B, includes the light emitting device 10 described above, a phosphor layer 101, and a light reflective layer 102.

The phosphor layer 101 (e.g., a layer containing YAG-based phosphor particles) is disposed on both the upper face of the first light emitting element 1 and the upper face of the second light emitting element 2 in such a manner as to be disposed across the both upper surfaces.

The light reflective layer 102 containing $SiO_2$ particles is disposed on the lateral faces of the first light emitting element 1 and the second light emitting element 2, upper face of the mounting board 17, and the lateral faces of the phosphor layer 101.

The light emitting device as described above can reduce the effect of uneven heat dissipation on the light emitting elements.

More uniform heat dissipation can improve the overall heat dissipation effect of the light emitting elements, thereby preventing or discouraging the deterioration of the light emitting elements and achieving a highly reliable and high quality light emitting device.

Embodiment 13

Figure 13A:
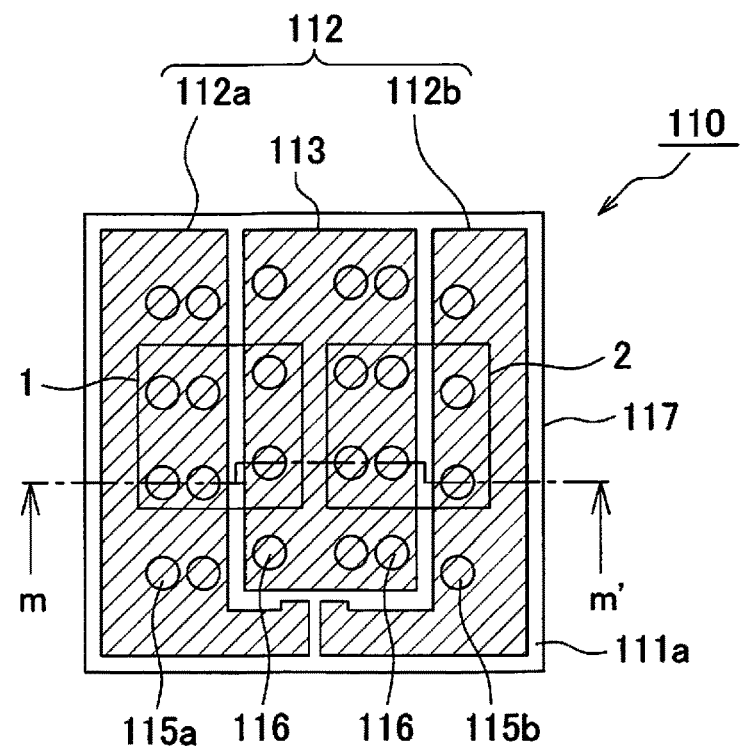
FIG. 13A is a schematic plan view of a light emitting device according to Embodiment 13.
Figure 13B:
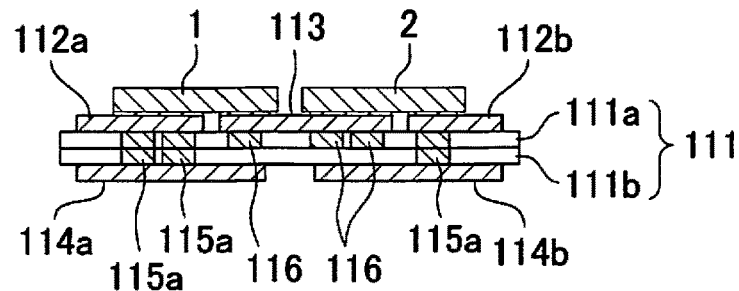
FIG. 13B is a schematic cross-sectional view taken along line m-m' of FIG. 13.
Figure 13C:
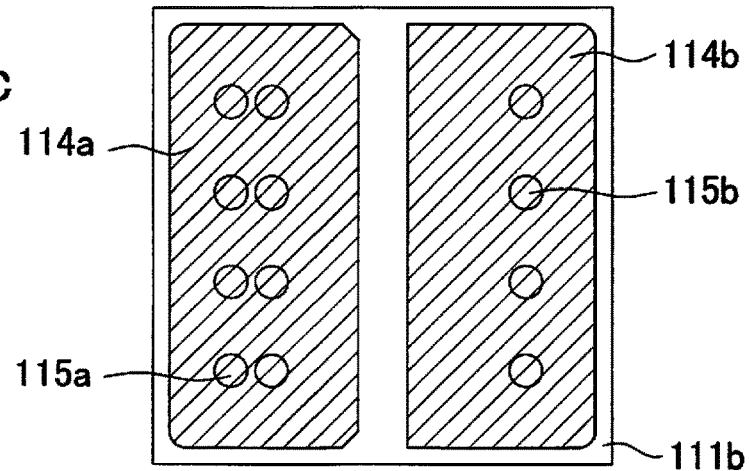
FIG. 13C is a back face view of the light emitting device according to Embodiment 13.

The light emitting device 110 according to Embodiment 13, as shown in FIG. 13A to 13C, includes a mounting board 117, and a first light emitting element 1 and a second light emitting element 2 both arranged on the mounting board 117. The first light emitting element 1 and a second light emitting element 2 are mounted to be connected in series.

The mounting board 117 has an insulator 111 which is a stack of two insulator layers 111a and 111b, a pair of front face wiring parts 112a and 112b, a connection wiring part 113, a pair of back face terminals 114a and 114b, first interlayer wiring parts 115a and 115b, and second interlayer wiring parts 116.

In the light emitting device 110 according to Embodiment 13, in a plan view, the area of overlap between the connection wiring part 113 and the first light emitting element 1 is different from the area of overlap between the second light emitting element 2 and the connection wiring part 113. In other words, the area of overlap between the second light emitting element 2 and the connection wiring part 113 is larger than the area of overlap between the first light emitting element 1 and the connection wiring part 113. For this reason, the number of the first interlayer wiring parts 115a disposed immediately under the first light emitting element 1 differs from the number of the first interlayer wiring parts 115b disposed immediately under the second light emitting element 2. Four first interlayer wiring parts 115a are provided immediately under the first light emitting element 1, and two first interlayer wiring parts 115b are provided immediately under the second light emitting element 2. The numbers of second interlayer wiring parts 116 disposed immediately under the first light emitting element 1 also differ to those disposed immediately under the second light emitting element 2. Two second interlayer wiring parts 116 are provided directly below the first light emitting element 1, and four second interlayer wiring parts 116 are provided directly below the second light emitting element 2. The other configurations are effectively the same or similar to those of the light emitting device 10.

The light emitting device 110 configured as above has the same or similar effect to that achieved by the light emitting device 10.

In the light emitting device 110 according to Embodiment 11 includes, in particular, a larger number of second interlayer wiring parts 116 immediately under the light emitting element 2 which has a larger area of overlap with the connection wiring part 113 in a plan view, compared to that immediately under the first light emitting element 1 which has a smaller area of overlap with the connection wiring part 113. This enables the second interlayer wiring parts 116 to more effectively contribute to drawing away the heat generated by the light emitting element which is provided with more second interlayer wiring parts.

The light emitting device according to the present disclosure can be used in display devices, lighting equipment, displays, liquid crystal display backlight sources, projectors (particularly mobile projectors), laser displays, vehicular light sources, and the like.

What is claimed is:

1. A light emitting device comprising:
   a mounting board which includes
      an insulator including a front face and a back face,
      a pair of front face wiring parts disposed on the front face of the insulator,
      a connection wiring part disposed on the front face of the insulator, and spaced apart from the front face wiring parts,
      a pair of back face terminals disposed on the back face of the insulator,
      first interlayer wiring parts penetrating the insulator and electrically connecting the front face wiring parts and the back face terminals, and
      one or more second interlayer wiring parts embedded in the insulator to be in contact with the connection wiring part and spaced apart from the back face terminals;
   a first light emitting element disposed to straddle one of the pair of front face wiring parts and the connection wiring part; and
   a second light emitting element disposed to straddle the other of the pair of front face wiring parts and the connection wiring part, wherein
   each of the first interlayer wiring parts is respectively disposed to overlap at least one of the first light emitting element and the second light emitting element in a plan view.

2. The light emitting device according to claim 1, wherein at least one of the one or more second interlayer wiring parts is disposed to overlap at least one of the first light emitting element and the second light emitting element in a plan view.

3. The light emitting device according to claim 1, wherein at least one of the one or more second interlayer wiring parts is disposed to overlap at least one of the back face terminals in a plan view.

4. The light emitting device according to claim 1, further comprising
   a heat dissipation terminal disposed on the back face of the insulator and spaced apart from the back face terminals and the second interlayer wiring parts, wherein
   at least one of the one or more second interlayer wiring part is disposed to overlap the heat dissipation terminal in a plan view.

5. The light emitting device according to claim 4, further comprising
   a third interlayer wiring part embedded in the insulator to be in contact with the heat dissipation terminal, and spaced apart from the second interlayer wiring parts.

6. The light emitting device according to claim 1, further comprising:
   an additional connection wiring part disposed on the front face of the insulator, and spaced apart from the connection wiring part and the front face wiring parts; and
   one or more third light emitting elements disposed to straddle the connection wiring part and the additional connection wiring part, wherein
   the second interlayer wiring parts respectively disposed in contact with the connection wiring part and the additional connection wiring part both overlapping at least one of the one or more third light emitting elements in a plan view.

7. The light emitting device according to claim 1, further comprising:
   a fourth interlayer wiring part embedded in the insulator to be in contact with one of the back face terminals and spaced apart from the one or more second interlayer wiring parts.

8. The light emitting device according to claim 1, wherein at least one of material of the front face wiring parts, material of the connection wiring part, material of the first interlayer wiring parts, material of the back face terminals, and material of the one or more second interlayer wiring parts includes copper or a copper alloy.

9. The light emitting device according to claim 1, wherein the number of the first interlayer wiring parts disposed immediately under the first light emitting element is different to the number of the first interlayer wiring parts disposed immediately under the second light emitting element.

10. The light emitting device according to claim 1, wherein
   the number of the one or more second interlayer wiring parts disposed immediately under the first light emitting element is different to the number of the one or more second interlayer wiring parts disposed immediately under the second light emitting element.

11. The light emitting device according to claim 1, wherein
   the first light emitting element and the second light emitting element are flip chip mounted on the mounting board.

12. The light emitting device according to claim 1, further comprising
   a phosphor layer covering the first light emitting element and the second light emitting element.

13. The light emitting device according to claim 1, wherein
   the insulator is a ceramic stack.

14. A light emitting device comprising:
   a mounting board which includes
      an insulator including a front face and a back face, the insulator being a ceramic stack, a pair of front face wiring parts disposed on the front face of the insulator,
a connection wiring part disposed on the front face of the insulator, and spaced apart from the front face wiring parts,
a pair of back face terminals disposed on the back face of the insulator,
first interlayer wiring parts penetrating the insulator and electrically connecting the front face wiring parts and the back face terminals, and
one or more second interlayer wiring parts embedded in the insulator to be in contact with the connection wiring part and spaced apart from the back face terminals;
a first light emitting element disposed to straddle one of the pair of front face wiring parts and the connection wiring part; and
a second light emitting element disposed to straddle the other of the pair of front face wiring parts and the connection wiring part.

15. The light emitting device according to claim 14, wherein
at least one of the one or more second interlayer wiring parts is disposed to overlap at least one of the first light emitting element and the second light emitting element in a plan view.

16. The light emitting device according to claim 14, wherein
at least one of the one or more second interlayer wiring parts is disposed to overlap at least one of the back face terminals in a plan view.

17. The light emitting device according to claim 14, further comprising
a heat dissipation terminal disposed on the back face of the insulator and spaced apart from the back face terminals and the second interlayer wiring parts, wherein
at least one of the one or more second interlayer wiring part is disposed to overlap the heat dissipation terminal in a plan view.

18. The light emitting device according to claim 17, further comprising
a third interlayer wiring part embedded in the insulator to be in contact with the heat dissipation terminal, and spaced apart from the second interlayer wiring parts.

19. The light emitting device according to claim 14, further comprising:
an additional connection wiring part disposed on the front face of the insulator, and spaced apart from the connection wiring part and the front face wiring parts; and
one or more third light emitting elements disposed to straddle the connection wiring part and the additional connection wiring part, wherein
the second interlayer wiring parts respectively disposed in contact with the connection wiring part and the additional connection wiring part both overlapping at least one of the one or more third light emitting elements in a plan view.

20. The light emitting device according to claim 14, further comprising:
a fourth interlayer wiring part embedded in the insulator to be in contact with one of the back face terminals and spaced apart from the one or more second interlayer wiring parts.

21. The light emitting device according to claim 14, wherein
at least one of material of the front face wiring parts, material of the connection wiring part, material of the first interlayer wiring parts, material of the back face terminals, and material of the one or more second interlayer wiring parts includes copper or a copper alloy.

22. The light emitting device according to claim 14, wherein
the number of the first interlayer wiring parts disposed immediately under the first light emitting element is different to the number of the first interlayer wiring parts disposed immediately under the second light emitting element.

23. The light emitting device according to claim 14, wherein
the number of the one or more second interlayer wiring parts disposed immediately under the first light emitting element is different to the number of the one or more second interlayer wiring parts disposed immediately under the second light emitting element.

24. The light emitting device according to claim 14, wherein
the first light emitting element and the second light emitting element are flip chip mounted on the mounting board.

25. The light emitting device according to claim 14, further comprising
a phosphor layer covering the first light emitting element and the second light emitting element.

26. The light emitting device according to claim 14, further comprising
a light reflective layer disposed in the perimeters of the first light emitting element and the second light emitting element.

27. The light emitting device according to claim 26, wherein
the light reflective layer contains one of $SiO_2$, $TiO_2$, $ZrO_2$, $BaSO_4$, and $MgO$.

28. The light emitting device comprising:
a mounting board which includes
an insulator including a front face and a back face,
a pair of front face wiring parts disposed on the front face of the insulator,
a connection wiring part disposed on the front face of the insulator, and spaced apart from the front face wiring parts,
a pair of back face terminals disposed on the back face of the insulator,
first interlayer wiring parts penetrating the insulator and electrically connecting the front face wiring parts and the back face terminals, and
one or more second interlayer wiring parts embedded in the insulator to be in contact with the connection wiring part and spaced apart from the back face terminals;
a first light emitting element disposed to straddle one of the pair of front face wiring parts and the connection wiring part;
a second light emitting element disposed to straddle the other of the pair of front face wiring parts and the connection wiring part; and
a light reflective layer disposed in the perimeters of the first light emitting element and the second light emitting element.

29. The light emitting device according to claim 28, wherein the light reflective layer contains one of $SiO_2$, $TiO_2$, $ZrO_2$, $BaSO_4$, and MgO.

30. The light emitting device according to claim 28, wherein
at least one of the one or more second interlayer wiring parts is disposed to overlap at least one of the first light emitting element and the second light emitting element in a plan view.

31. The light emitting device according to claim 28, wherein
at least one of the one or more second interlayer wiring parts is disposed to overlap at least one of the back face terminals in a plan view.

32. The light emitting device according to claim 28, further comprising
a heat dissipation terminal disposed on the back face of the insulator and spaced apart from the back face terminals and the second interlayer wiring parts, wherein
at least one of the one or more second interlayer wiring part is disposed to overlap the heat dissipation terminal in a plan view.

33. The light emitting device according to claim 32, further comprising
a third interlayer wiring part embedded in the insulator to be in contact with the heat dissipation terminal, and spaced apart from the second interlayer wiring parts.

34. The light emitting device according to claim 28, further comprising:
an additional connection wiring part disposed on the front face of the insulator, and spaced apart from the connection wiring part and the front face wiring parts; and
one or more third light emitting elements disposed to straddle the connection wiring part and the additional connection wiring part, wherein
the second interlayer wiring parts respectively disposed in contact with the connection wiring part and the additional connection wiring part both overlapping at least one of the one or more third light emitting elements in a plan view.

35. The light emitting device according to claim 28, further comprising:
a fourth interlayer wiring part embedded in the insulator to be in contact with one of the back face terminals and spaced apart from the one or more second interlayer wiring parts.

36. The light emitting device according to claim 28, wherein
at least one of material of the front face wiring parts, material of the connection wiring part, material of the first interlayer wiring parts, material of the back face terminals, and material of the one or more second interlayer wiring parts includes copper or a copper alloy.

37. The light emitting device according to claim 28, wherein
the number of the first interlayer wiring parts disposed immediately under the first light emitting element is different to the number of the first interlayer wiring parts disposed immediately under the second light emitting element.

38. The light emitting device according to claim 28, wherein
the number of the one or more second interlayer wiring parts disposed immediately under the first light emitting element is different to the number of the one or more second interlayer wiring parts disposed immediately under the second light emitting element.

39. The light emitting device according to claim 28, wherein
the first light emitting element and the second light emitting element are flip chip mounted on the mounting board.

40. The light emitting device according to claim 28, further comprising
a phosphor layer covering the first light emitting element and the second light emitting element.

* * * * *